(12) United States Patent
Schillak et al.

(10) Patent No.: US 10,627,463 B2
(45) Date of Patent: Apr. 21, 2020

(54) SIMULTANEOUS TX-RX FOR ANTENNA DEVICES

(71) Applicant: Life Services LLC, Minneapolis, MN (US)

(72) Inventors: Scott M. Schillak, Minneapolis, MN (US); John Thomas Vaughan, Stillwater, MN (US); Charles A. Lemaire, Apple Valley, MN (US); Matthew T. Waks, Coon Rapids, MN (US)

(73) Assignee: Life Services, LLC, Minneapolis, MN (US)

( * ) Notice: Subject to any disclaimer, the term of this patent is extended or adjusted under 35 U.S.C. 154(b) by 1218 days.

(21) Appl. No.: 14/818,282

(22) Filed: Aug. 4, 2015

(65) Prior Publication Data

US 2015/0338478 A1 Nov. 26, 2015

Related U.S. Application Data

(62) Division of application No. 13/407,751, filed on Feb. 28, 2012, now Pat. No. 9,097,769.

(60) Provisional application No. 61/447,673, filed on Feb. 28, 2011.

(51) Int. Cl.
*G01R 33/36* (2006.01)
*G01R 33/54* (2006.01)
*G01R 33/3415* (2006.01)

(52) U.S. Cl.
CPC ..... *G01R 33/3607* (2013.01); *G01R 33/3614* (2013.01); *G01R 33/3621* (2013.01); *G01R 33/54* (2013.01); *G01R 33/3415* (2013.01); *G01R 33/3692* (2013.01)

(58) Field of Classification Search
CPC ............ G01R 33/3607; G01R 33/3614; G01R 33/54; G01R 33/3621
See application file for complete search history.

(56) References Cited

U.S. PATENT DOCUMENTS

| 3,810,001 A | * | 5/1974 | Ernst | G01R 33/4641 324/313 |
| 4,793,356 A | * | 12/1988 | Misic | G01R 33/341 324/318 |
| 4,806,866 A | * | 2/1989 | Maier | G01R 33/4833 324/313 |

(Continued)

*Primary Examiner* — Dixomara Vargas
(74) *Attorney, Agent, or Firm* — Quarles & Brady LLP

(57) ABSTRACT

Apparatus and method that are more efficient and flexible, and obtain and connect high-power RF transmit signals (TX) to RF-coil devices in an MR machine or other devices and simultaneously receive signals (RX) and separate net receive signals NRX) of interest by subtracting or filtering to remove the subtractable portion of the transmit signal (STX) from the RX and preamplifying the NRX and signal processing the preamplified NRX. In some embodiments, signal processing further removes artifacts of the transmitted signal, e.g., by digitizing the NRX signal, storing the digitized NRX signal in a memory, and performing digital signal processing. In some embodiments, the present invention also includes pre-distorting the TX signals in order to be better able to identify and/or remove the remaining artifacts of the transmitted signal from the NRX signal. This solution also applies to other high-power RF-transmit-antennae signals.

20 Claims, 17 Drawing Sheets

(56) References Cited

U.S. PATENT DOCUMENTS

| | | | | |
|---|---|---|---|---|
| 5,457,386 A | * | 10/1995 | Matsunaga | G01R 33/34053 324/318 |
| 5,461,314 A | * | 10/1995 | Arakawa | G01R 33/3628 324/318 |
| 7,072,718 B2 | * | 7/2006 | Von Arx | A61N 1/37229 607/32 |
| 7,800,370 B2 | * | 9/2010 | Du | G01R 33/3415 324/318 |
| 8,193,810 B2 | * | 6/2012 | Otake | G01R 33/34046 324/307 |
| 8,604,791 B2 | * | 12/2013 | Vaughan, Jr. | G01R 33/3415 324/318 |
| 8,643,364 B2 | * | 2/2014 | Umeda | G01R 33/3678 324/309 |
| 2009/0128155 A1 | * | 5/2009 | Otake | G01R 33/34046 324/322 |
| 2009/0140740 A1 | * | 6/2009 | Du | G01R 33/3415 324/318 |
| 2011/0121829 A1 | * | 5/2011 | Umeda | G01R 33/3678 324/309 |
| 2012/0062230 A1 | * | 3/2012 | Vaughan, Jr. | G01R 33/3415 324/318 |
| 2012/0163619 A1 | * | 6/2012 | Kinoshita | H02J 17/00 381/77 |
| 2014/0097846 A1 | * | 4/2014 | Lemaire | G01R 33/3415 324/322 |

\* cited by examiner

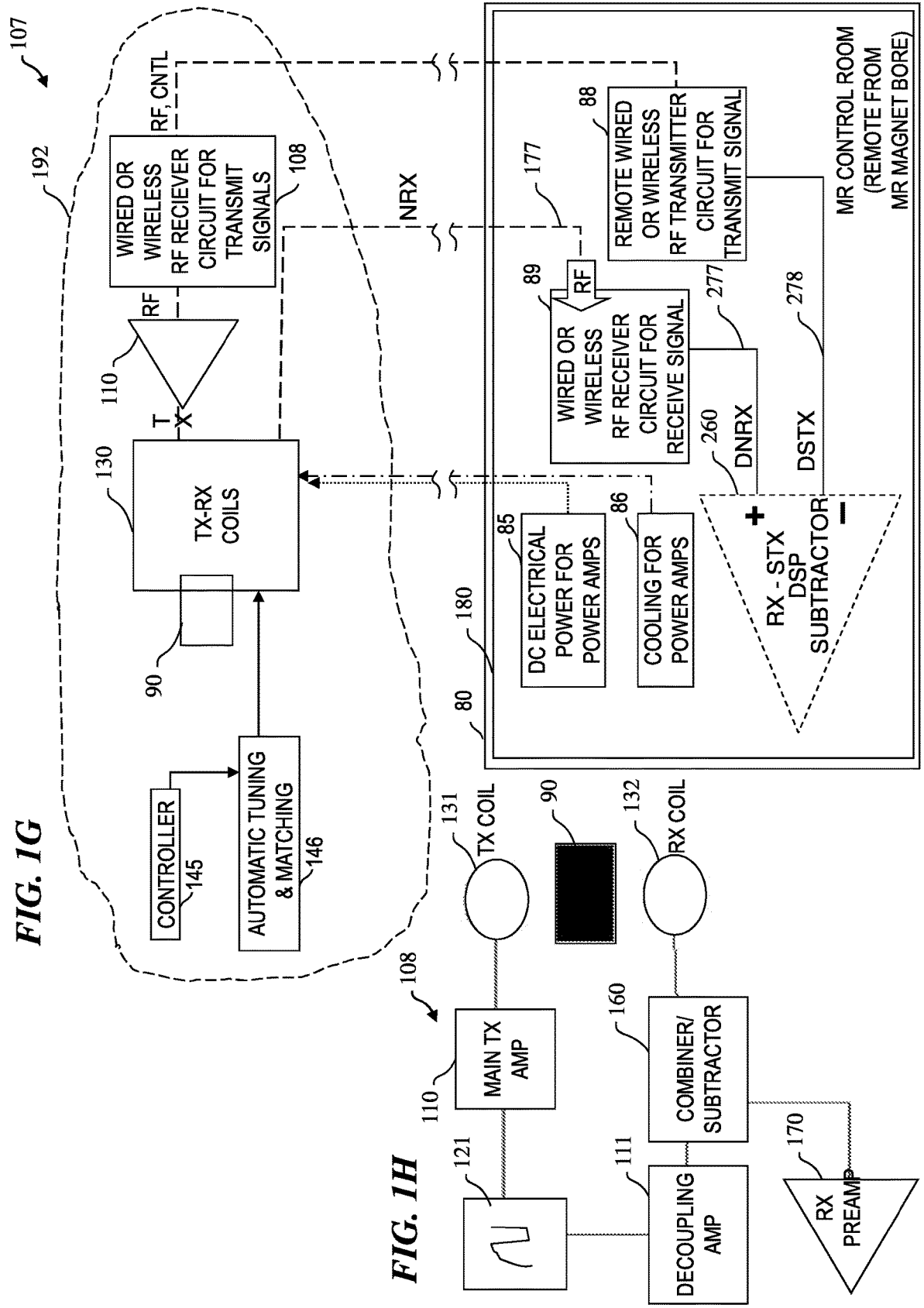

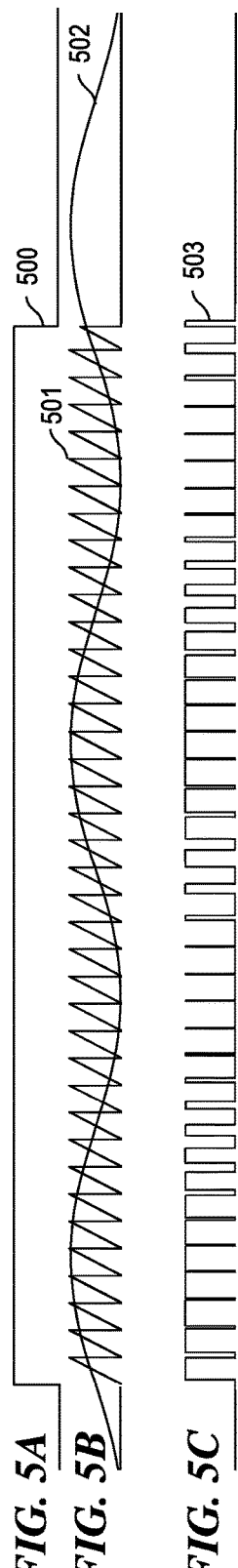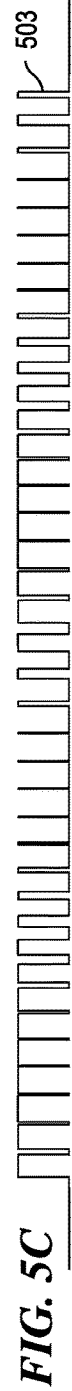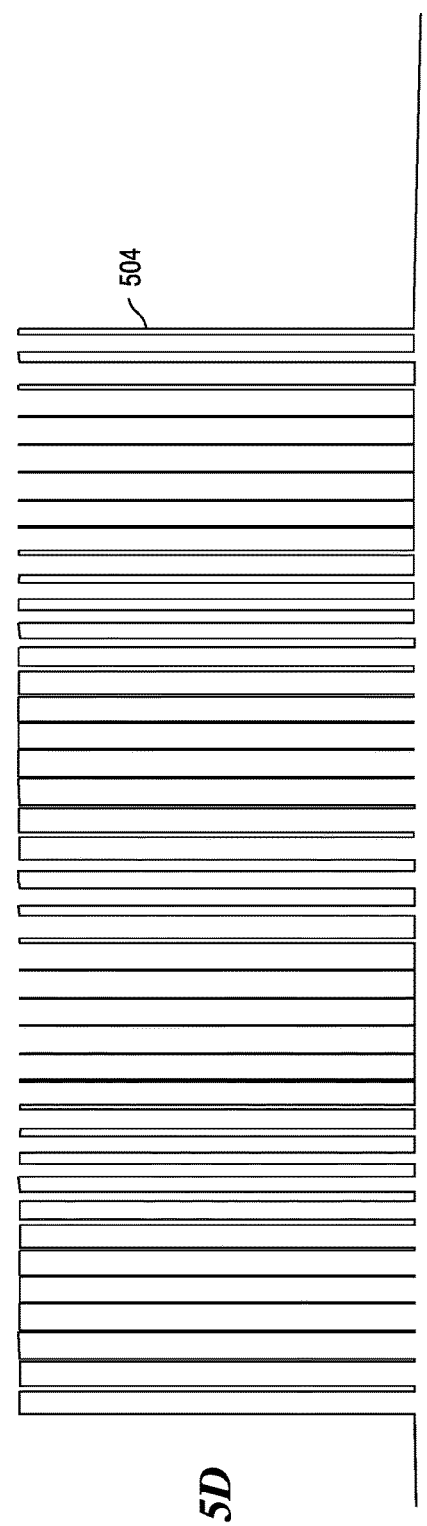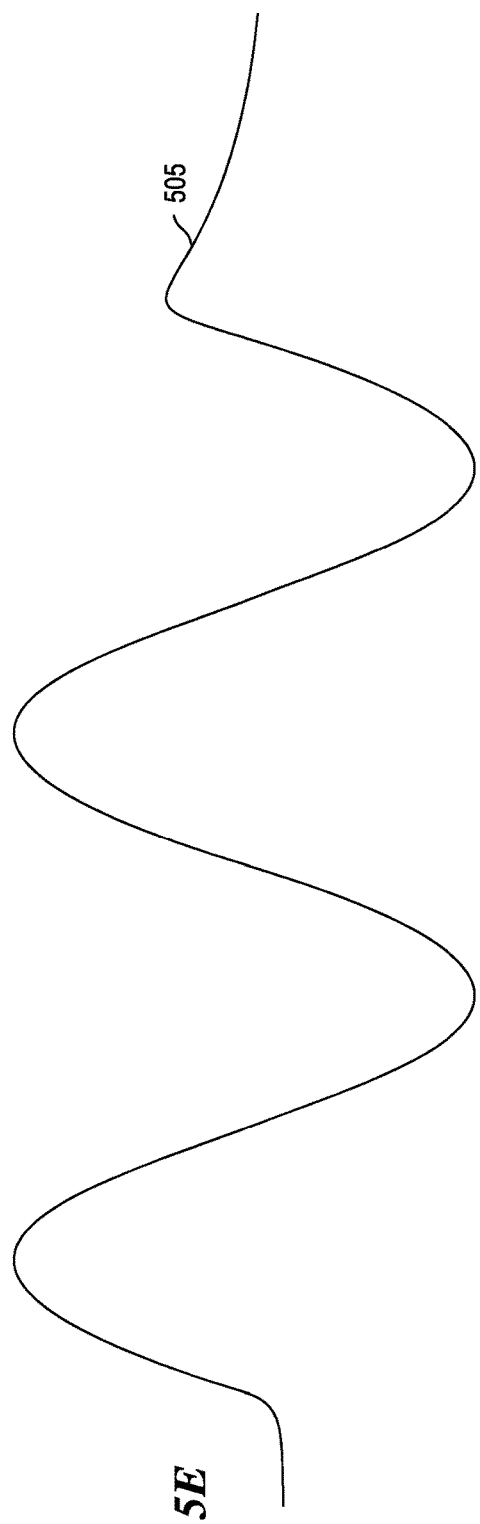
FIG. 5A
FIG. 5B
FIG. 5C
FIG. 5D
FIG. 5E

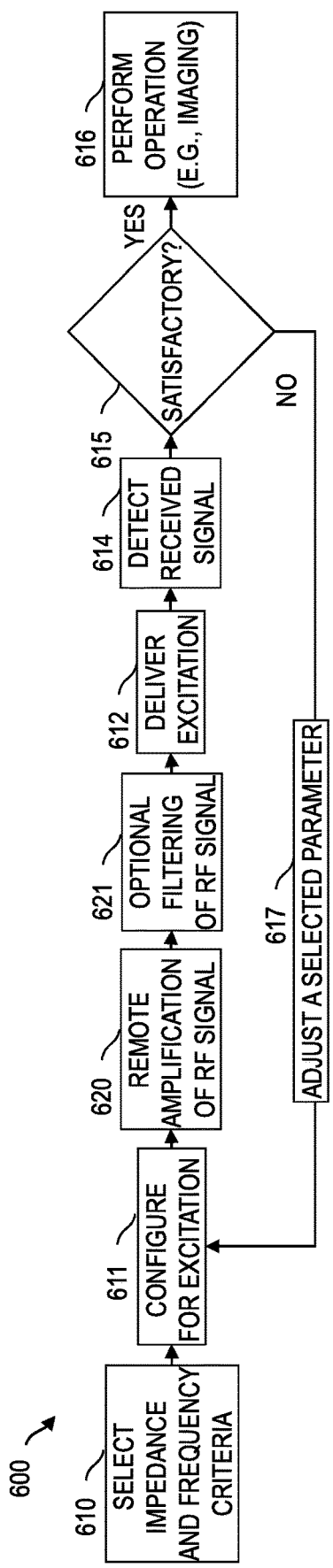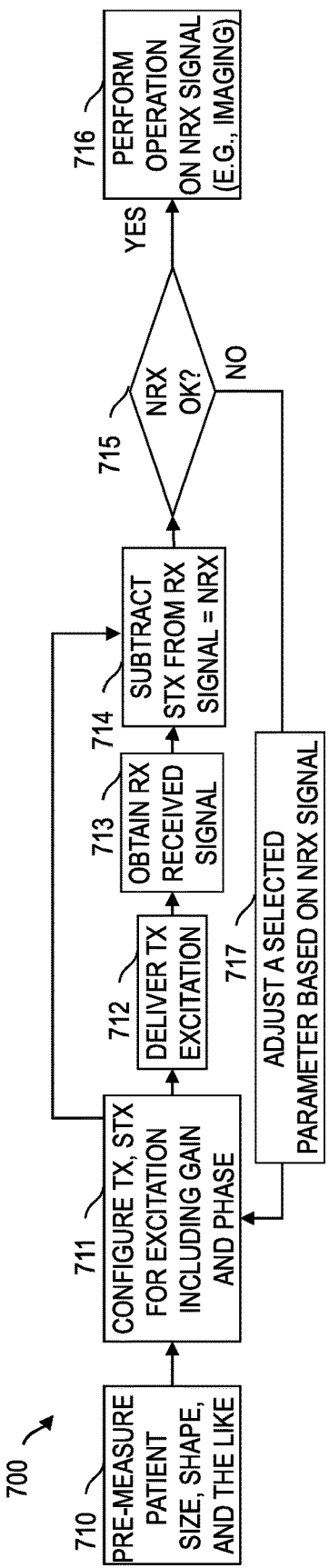

SIMULTANEOUS TX-RX FOR ANTENNA DEVICES

CROSS-REFERENCE TO RELATED APPLICATIONS

This application is a divisional of U.S. patent application Ser. No. 13/407,751 filed Feb. 28, 2012 by Scott M. Schillak et al., titled "Simultaneous TX-RX for MRI systems and other antenna devices" (which will issue as U.S. Pat. No. 9,097,769 on Aug. 4, 2015), which claims priority benefit under 35 U.S.C. § 119(e) of U.S. Provisional Patent Application No. 61/447,673 filed Feb. 28, 2011 by Scott M. Schillak et al., titled "Simultaneous TX-RX for MRI systems and other antenna devices," each of which is incorporated herein by reference in its entirety.

FIELD OF THE INVENTION

This invention relates to the field of transceiver antenna circuits, and more specifically to a method and apparatus for receiving an RF (radio frequency) signal while simultaneously transmitting a signal of like frequency into a common volume of space, wherein the received signal is processed to remove the unwanted received portion of the transmitted signal to leave the desired receive signal of interest. The present invention is applicable to magnetic-resonance imaging and spectroscopy where the transmitted excitation signal needs to be removed from the received signal to obtain the MR response from the person or object being measured. In some embodiments, a subtractable version of the transmit signal is subtracted from the received signal to leave just the received signal of interest (which otherwise would be "buried" by the noise of the transmit signal. In some embodiments, the subtractable version of the transmit signal is split from the main transmit signal, while in other embodiments, a replica of the transmit signal is generated in the case where the subtractable version of the transmit signal is obtained from other than the main transmit signal. In some embodiments, the present invention optionally includes actively adjusting gains, frequencies and/or phases of one or more transmit signals being sent to a plurality of transmit coil/antenna elements (which controls the magnitude, phase, frequency, spatial profile, and temporal profile of the transmitted RF signal) and/or actively adjusting gains, phases and/or signal combinations of one or more receive signals (which controls the magnitude, phase, spatial profile, and temporal profile of the received RF signal) and then subtracting the subtractable version of the transmit signal (STX) from the received signal (RX) to obtain a net received signal (NRX). In some embodiments, the subtracting of the STX from the RX to obtain the NRX is done before the first preamplifier of the receive circuit to protect those electronics from the high power portion of the TX signal that is initially in the RX. In some embodiments, the components are compatible with, and function in, high fields (such as a magnetic field of up to and exceeding one tesla or even ten tesla or more and/or an RF electric field of many thousands of volts per meter).

BACKGROUND OF THE INVENTION

Conventional magnetic-resonance (MR) machines (such as MR imaging (MRI) machines or MR spectroscopy (MRS) machines) employ a high-field-strength magnet (e.g., a superconducting-coil magnet having a constant (DC) magnetic field of about one tesla (1 T) or more, as well as a gradient magnet coil (which generates an additional magnetic field whose strength varies over space in a desired manner), and a radio-frequency (RF) transmit-and-receive coil device (RF-coil device) that includes a plurality of transmit-antenna elements and a plurality of receive-antenna elements. RF signal generators and RF power amplifiers are conventionally located in a control room remote from the RF-coil devices, and the RF power amplifiers have their output signals combined and then coupled to the RF-coil device via high-power-capability well-shielded coaxial cables (frequently called just "coax"). Such conventional designs typically use a plurality of medium-to-high power amplifiers (e.g., in some conventional circuits, each such medium-high power amplifiers is capable of outputting 500 W to 5000 W) together to amplify an RF signal, thus generating a plurality of medium-to-high power RF signals (e.g., wherein the total RF power of this plurality of signals may be as high as 50 kW), and these are combined (using a combiner circuit that often incurs losses of up to 50% or more of the signal) to form a single very-high-power signal (of perhaps 30 kW, due to losses taken from the 50 kW in the plurality of medium-power signals) and then transmitted (using coaxial cables that typically incur additional losses of up to 50% or more of the signal by the time the signal is coupled to the RF-coil device in the MR magnet bore (the opening through the center of the DC magnet)). Because of the high power of the RF transmit signal, it is infeasible to wirelessly couple it from the remote control-room power amplifiers to the RF-coil device in the MR magnet bore.

In conventional magnetic-resonance (MR) machines (such as MRI machines or MRS machines), the excitation RF signal is a pulsed RF signal that is transmitted before in time, and not overlapped with, the receive signal. The received RF signal of interest is extremely small compared to the transmit signal, and the receive pre-amplifiers (pre-amps) would be overloaded or damaged if they are coupled to the receive antenna at a time simultaneous with the excitation RF pulse being transmitted.

U.S. patent application Ser. No. 12/879,000 titled "ACTIVE TRANSMIT ELEMENTS FOR MRI COILS AND OTHER ANTENNA DEVICES" filed 9 Sep. 2010 by John Thomas Vaughan, Jr. et al. (which issued as U.S. Pat. No. 8,604,791 on 10 Dec. 2013) is incorporated herein by reference.

U.S. Provisional Patent Application Ser. No. 61/371,170 filed 5 Aug. 2010 by John Thomas Vaughan, Jr. titled "COILS FOR HUMAN WHOLE-BODY IMAGING AT 7 T" is incorporated herein by reference.

U.S. patent application Ser. No. 12/719,841 filed 8 Mar. 2010 by Carl Snyder et al. titled "REMOTELY ADJUSTABLE REACTIVE AND RESISTIVE ELECTRICAL ELEMENTS AND METHOD" (which issued as U.S. Pat. No. 8,299,681 on 30 Oct. 2012) is incorporated herein by reference. Snyder et al. describe an apparatus and method that include providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

The basis of MRI is the directional magnetic field, or moment, associated with charged particles in motion. Nuclei containing an odd number of protons and/or neutrons have a characteristic motion or precession. Because nuclei are charged particles, this precession produces a small magnetic moment. When a human body is placed in a large magnetic field, many of the free hydrogen nuclei align themselves with the direction of the magnetic field. The nuclei precess about the magnetic field direction like gyroscopes. This behavior is termed Larmor precession. The frequency of Larmor precession is proportional to the applied magnetic field strength as defined by the Larmor frequency, $\omega_0 = \gamma B_0$, where $\gamma$ is the gyromagnetic ratio and $B_0$ is the strength of the applied magnetic field. The gyromagnetic ratio is a nuclei specific constant. For hydrogen, $\gamma = 42.5$ MHz/Tesla. To obtain an MR image of an object, the object is placed in a uniform high-strength magnetic field, of between 0.5 to 1.5 Tesla. As a result, the object's hydrogen nuclei align with the magnetic field $B_0$ and create a net magnetic moment $M_0$ parallel to $B_0$. Next, a radio-frequency (RF) pulse, $B_{rf}$, is applied perpendicular to $B_0$. This pulse, with a frequency equal to the Larmor frequency, causes M to tilt away from $B_0$. Once the RF signal is removed, the nuclei realign themselves such that their net magnetic moment, M, is again parallel with $B_0$. This return to equilibrium is referred to as relaxation. During relaxation, the nuclei lose energy by emitting their own RF signal. This signal is referred to as the free-induction decay (FID) response signal. The FID response signal is measured by a conductive field coil placed around the object being imaged. This measurement is processed or reconstructed to obtain 3D MR images. (This paragraph is by Blair Mackiewich, Masters thesis, 1995)

For example, approximately 64 MHz is used for MRI machines having 1.5-Tesla magnets (these are used for most MR machine platforms in the world today), 128 MHz is used for MRI machines having 3-T magnets (currently the fastest-growing segment of the MR market), 300 MHz is used for MRI machines having 7-T magnets (considered the highest-field machines supported by industry today), 400 MHz is used for MRI machines having 9.4-T magnets (it is believed there are now only three in use in the world), and 450 MHz is used for the MRI machine having a 10.5-T magnet (currently, just the Center for Magnetic Resonance Research (CMRR) at the University of Minnesota operates one of these).

U.S. Pat. No. 4,682,125 to Harrison et al. issued 21 Jul. 1987 titled "RF coil coupling for MRI with tuned RF rejection circuit using coax shield choke" is incorporated herein by reference in its entirety for all purposes. Harrison et al. describe undesirable RF coupling via the outside of an outer coaxial cable conductor to/from RF coils in a magnetic resonance imaging apparatus is minimized by employing a parallel resonance tuned RF choke in the circuit. The choke is realized by forming a short coiled section of the coaxial cable with a lumped fixed capacitance connected in parallel thereacross and a conductive tuning rod positioned within the center of the coiled section so as to trim the parallel resonant frequency to the desired value.

U.S. Pat. No. 4,763,076 to Arakawa et al. issued 9 Aug. 1988 titled "MRI transmit coil disable switching via RF in/out cable" is incorporated herein by reference in its entirety for all purposes, and describes a detuning/decoupling arrangement for a Magnetic Resonance Imaging (MRI) system RF coil arrangement (of the typing using the nuclear magnetic resonance (NMR) phenomenon) that uses switching diodes to selectively connect and disconnect portions of an RF resonant circuit in response to a DC control signal. The DC control signal selectively forward biases and reverse biases the switching diodes. The DC control current is fed to the resonant circuit along the same RF transmission line used to feed RF signals to/from the circuit. An in-line coaxial shielded RF choke connected to the RF transmission line isolates the DC control signals from the RF signals flowing on the same transmission line—reducing the number and complexity of isolation devices required on the ends of the transmission line to separate the RF and DC signals.

Conventional MR machines and their components and operation are described in numerous patents and patent application such as U.S. Pat. No. 4,947,119 to Ugurbil et al., U.S. Pat. No. 5,908,386 to Ugurbil et al., U.S. Pat. No. 6,650,116 to Garwood et al., U.S. Pat. No. 6,788,056 to Vaughan et al., U.S. Pat. No. 6,788,057 to Petropoulos et al., U.S. Pat. No. 6,788,058 to Petropoulos et al., U.S. Pat. No. 6,930,480 to Fijita et al., U.S. Pat. No. 6,946,840 to Zou et al., U.S. Pat. No. 6,958,607 to Vaughan et al., U.S. Pat. No. 6,969,992 to Vaughan et al., U.S. Pat. No. 6,975,115 to Fujita et al., U.S. Pat. No. 6,977,502 to Hertz, U.S. Pat. No. 6,980,002 to Petropoulos et al., U.S. Pat. No. 7,042,222 to Zheng et al., U.S. Pat. No. 7,084,631 to Qu et al., U.S. Pat. No. 7,279,899 to Michaeli et al., U.S. Pat. No. 7,403,006 to Garwood et al., U.S. Pat. No. 7,514,926 to Vaughan et al., U.S. Pat. No. 7,598,739 to Vaughan et al., U.S. Pat. No. 7,633,293 to Olson et al., U.S. Pat. No. 7,710,117 to Vaughan et al., U.S. Patent Publication 2004/0027128A1 of Vaughan et al., U.S. Patent Publication 2006/0001426A1 of Vaughan et al., U.S. Patent Publication 2008/0084210A1 of Vaughan et al., U.S. Patent Publication 2008/0129298A1 of Vaughan et al., U.S. Patent Publication 2009/0115417A1 of Akgun et al., U.S. Patent Publication 2009/0237077A1 of Vaughan et al., and U.S. Patent Publication 2009/0264733A1 of Corum et al.; all of which are incorporated herein by reference in their entirety for all purposes.

U.S. Pat. No. 7,777,484 to Garwood et al. issued Aug. 17, 2010 titled "Frequency swept excitation for magnetic resonance" (incorporated herein by reference in its entirety for all purposes) describes a method of magnetic resonance that uses a frequency-swept excitation wherein the acquired signal is a time domain signal is provided. In one embodiment, the method includes, applying a sweeping frequency excitation and acquiring a time-domain signal. The sweeping frequency excitation has a duration and is configured to sequentially excite isochromats having different resonant frequencies. Acquisition of the time domain signal is done during the duration of the sweeping frequency excitation. The time domain signal is based on evolution of the isochromats.

U.S. Pat. No. 6,888,348 to Kupce issued May 3, 2005 titled "Decoupling sideband resolved NMR spectroscopy (desire)" (incorporated herein by reference in its entirety for all purposes) described a system in which cycling sidebands arising from broadband decoupling of I-S heteronuclei are separated from the decoupled I spectra investigated in a 2D pulse sequence wherein I excitation is followed after the interval $\delta+t_1$ with refocusing $\pi$ pulse operating on the I spins. After I excitation, the $J_{IS}$ coupling is inverted by $\pi$ pulse and immediately following the $\pi$ pulse, decoupling is turned on and maintained while signal acquisition in the interval $t_2$ is initiated at $\delta+t_1$ after pulse. Double FT yields a 2D spectrum with sidebands completely displaced to diagonal locii, or alternatively the time domain data may be accumulated into respective t2 locations by effectively summing over t1 to yield a single dimensional spectrum free of cycling sidebands.

U.S. Pat. No. 4,947,119 to Ugurbil et al. (incorporated herein by reference in its entirety for all purposes) describes several magnetic resonance imaging (MRI) methods using adiabatic excitation. One method accomplishes slice selection with gradient-modulated adiabatic excitation. Another method employs slice selection with adiabatic excitation despite large variations in $B_1$ magnitude. There is also described $_1H$ spectroscopy using solvent suppressive adiabatic pulses.

U.S. Pat. No. 5,908,386 to Ugurbil et al. (incorporated herein by reference in its entirety for all purposes) describes contrast preparation based on Modified Driven Equilibrium Fourier Transfer and generates T1 weighted images for assessment of the myocardial perfusion with contrast agent first-pass kinetics. The preparation scheme produces T1 contrast with insensitivity to arrhythmias in prospectively triggered sequential imaging.

U.S. Pat. No. 6,650,116 to Garwood et al. (incorporated herein by reference in its entirety for all purposes) describes performing MRI and NMR spectroscopy that improves the dynamic range of the received signal by using adiabatic RF pulses for spin excitation rather than for spin inversion. The preferred adiabatic RF excitation produces a spatially varying phase across the slab, and a sharp slab profile. The phase variation is divided up by a phase-encoding gradient into voxels having a phase variation that is negligible over the width of the voxel. The phase variation in the slab-select direction is, on the whole, large enough that the peak amplitude of the received signal is reduced and the signal width broadened.

U.S. Pat. No. 6,788,056 to Vaughan et al. (incorporated herein by reference in its entirety for all purposes) describes an apparatus with a radio frequency magnetic field unit to generate a desired magnetic field. In one embodiment, the radio frequency magnetic field unit includes a first aperture that is substantially unobstructed and a second aperture contiguous to the first aperture. In an alternative embodiment, the radio frequency magnetic field unit includes a first side aperture, a second side aperture and one or more end apertures. In one embodiment, a current element is removed from a radio frequency magnetic field unit to form a magnetic field unit having an aperture. In an alternative embodiment, two current elements located opposite from one another in a radio frequency magnetic field unit are removed to form a magnetic filed unit having a first side aperture and a second side aperture.

U.S. Pat. No. 6,788,057 to Petropoulos et al. (incorporated herein by reference in its entirety for all purposes) describes an MRI gradient coil set that includes a uniplanar Z-gradient coil, a biplanar X-gradient coil, and a biplanar Y-gradient coil. The coil set provides an open Z-axis face.

U.S. Pat. No. 6,788,058 to Petropoulos et al. (incorporated herein by reference in its entirety for all purposes) describes an MRI coil having an axis and a first end and an opposite second end with respect to said axis includes a first ring element at the first end, a second ring element, a third ring element, a fourth ring element at the second end where the first ring element encompasses a smaller area than each of the second, third, and fourth ring elements. The coil also includes a plurality of axial elements connected between the first, second, third and fourth ring elements. The third and fourth ring elements are axially closer than the first and second ring elements.

U.S. Pat. No. 6,930,480 to Fijita et al. (incorporated herein by reference in its entirety for all purposes) describes a partially parallel acquisition RF coil array for imaging a human head includes at least a first, a second and a third loop coil adapted to be arranged circumambiently about the lower portion of the head; and at least a forth, a fifth and a sixth coil adapted to be conformably arranged about the summit of the head. A partially parallel acquisition RF coil array for imaging a human head includes at least a first, a second, a third and a fourth loop coil adapted to be arranged circumambiently about the lower portion of the head; and at least a first and a second figure-eight or saddle coil adapted to be conformably arranged about the summit of the head.

U.S. Pat. No. 6,946,840 to Zou et al. (incorporated herein by reference in its entirety for all purposes) describes an MRI array coil includes a plurality of first coils in a receive coil array and a plurality of second coils in a transmit coil array. The receive coil array and the transmit coil array are electrically disjoint.

U.S. Pat. No. 6,958,607 to Vaughan et al. (incorporated herein by reference in its entirety for all purposes) describes a radio frequency magnetic field unit to generate a desired magnetic field. In one embodiment, the RF magnetic field unit includes a first aperture that is substantially unobstructed and a second aperture contiguous to the first aperture. In an alternative embodiment, the RF magnetic field unit includes a first side aperture, a second side aperture and one or more end apertures. In one embodiment, a current element is removed from a RF magnetic field unit to form a magnetic field unit having an aperture. In an alternative embodiment, two current elements located opposite from one another in a RF magnetic field unit are removed to form a magnetic field unit having a first side aperture and a second side aperture.

U.S. Pat. No. 6,969,992 to Vaughan et al. (incorporated herein by reference in its entirety for all purposes) describes an excitation and detection circuit having individually controllable elements for use with a multi-element RF coil. Characteristics of the driving signal, including, for example, the phase, amplitude, frequency and timing, from each element of the circuit is separately controllable using small signals. Negative feedback for the driving signal associated with each coil element is derived from a receiver coupled to that coil element.

U.S. Pat. No. 6,975,115 to Fujita et al. (incorporated herein by reference in its entirety for all purposes) describes a partially parallel acquisition RF coil array for imaging a sample includes at least a first, a second and a third coil adapted to be arranged circumambiently about the sample and to provide both contrast data and spatial-phase-encoding data.

U.S. Pat. No. 6,977,502 to Hertz (incorporated herein by reference in its entirety for all purposes) describes a configurable matrix receiver comprises a plurality of antennas that detect one or more signals. The antennas are coupled to a configurable matrix comprising a plurality of amplifiers, one or more switches that selectively couple the amplifiers in series fashion, and one or more analog-to-digital converters (ADCs) that convert the output signals generated by the amplifiers to digital form. For example, in one embodiment, a matrix comprises a first amplifier having a first input and a first output, and a second amplifier having a second input and a second output, a switch to couple the first output of the first amplifier to a the second input of the second amplifier, a first ADC coupled to the first output of the first amplifier, and a second ADC coupled to the second output of the second amplifier. In one embodiment, the signals detected by the antennas include magnetic resonance (MR) signals.

U.S. Pat. No. 6,980,002 to Petropoulos et al. (incorporated herein by reference in its entirety for all purposes) describes an MRI array coil for imaging a human includes a posterior array, an anterior torso array and an anterior head-neck-upper-chest array. The head-neck-upper-chest array has a head portion mountable to the anterior array and a neck-upper-chest portion hingingly attached to the head portion.

U.S. Pat. No. 7,042,222 to Zheng et al. (incorporated herein by reference in its entirety for all purposes) describes a phased-array knee coil that includes a transmit coil array and a receive coil array having a plurality of coils configured to provide a first imaging mode and a second imaging mode.

U.S. Pat. No. 7,084,631 to Qu et al. (incorporated herein by reference in its entirety for all purposes) describes an MRI array coil system and method for breast imaging. The MRI array coil system includes a top coil portion with two openings configured to receive therethrough objects to be imaged. The MRI array coil system further includes a bottom coil portion having two openings configured to access from sides of the bottom coil portion the objects to be imaged. The top coil portion and bottom coil portion each have a plurality of coil elements configured to provide parallel imaging.

U.S. Pat. No. 7,279,899 to Michaeli et al. (incorporated herein by reference in its entirety for all purposes) describes modulating transverse and longitudinal relaxation time contrast in a rotating frame based on a train of RF pulses.

U.S. Pat. No. 7,403,006 to Garwood et al. (incorporated herein by reference in its entirety for all purposes) describes magnetic resonance that uses a frequency-swept excitation wherein the acquired signal is a time domain signal is provided. In one embodiment, the sweeping frequency excitation has a duration and is configured to sequentially excite isochromats having different resonant frequencies. Acquisition of the time domain signal is done during the duration of the sweeping frequency excitation. The time domain signal is based on evolution of the isochromats.

U.S. Pat. No. 7,514,926 to Adriany et al. (incorporated herein by reference in its entirety for all purposes) describes a coil having a plurality of resonant elements and an adjustable frame. A position of at least one resonant element can be adjusted relative to at least one other resonant element. A variable impedance is coupled to adjacent resonant elements and the impedance varies as a function of a separation distance. Cables are coupled to each resonant element and are gathered at a junction in a particular manner.

U.S. Pat. No. 7,598,739 to Vaughan et al. (incorporated herein by reference in its entirety for all purposes) describes a plurality of linear current elements configured about a specimen to be imaged. A current in each current element is controlled independent of a current in other current elements to select a gradient and to provide radio frequency shimming. Each current element is driven by a separate channel of a transmitter and connected to a separate channel of a multi-channel receiver. The impedance, and therefore, the current, in each current element is controlled mechanically or electrically.

U.S. Pat. No. 7,633,293 to Olson et al. (incorporated herein by reference in its entirety for all purposes) describes technology for controlling non-uniformity in the $B_1$ field includes selecting the phase, magnitude, frequency, time, or spatial relationship among various elements of a multi-channel excitation coil in order to control the radio frequency (RF) power emanating from the coil antenna elements. Non-uniformity can be used to steer a constructively interfering $B_1$ field node to spatially correlate with an anatomic region of interest. A convex (quadratically constrained quadratic problem) formulation of the $B_1$ localization problem can be used to select parameters for exciting the coil. Localization can be used in simulated Finite Difference Time Domain $B_1$ field human-head distributions and human-head-phantom measurement.

U.S. Pat. No. 7,710,117 to Vaughan et al. (incorporated herein by reference in its entirety for all purposes) describes a current unit having two or more current paths that allows control of magnitude, phase, time, frequency and position of each of element in a radio frequency coil. For each current element, the current can be adjusted as to a phase angle, frequency and magnitude. Multiple current paths of a current unit can be used for targeting multiple spatial domains or strategic combinations of the fields generated/detected by combination of elements for targeting a single domain in magnitude, phase, time, space and frequency.

U.S. Patent Publication 2008/0129298A1 of Vaughan et al. (incorporated herein by reference in its entirety for all purposes) describes multi-channel magnetic resonance using a TEM coil.

U.S. Patent Publication 2009/0115417A1 of Akgun et al. (incorporated herein by reference in its entirety for all purposes) describes an RF having a plurality of transmission line elements, wherein at least one of the plurality of transmission line elements may have at least one dimension different than a dimension of another one of the plurality of transmission line elements. In some cases, each of the transmission line elements may include a signal line conductor and a ground plane conductor separated by a dielectric.

U.S. Patent Publication 2009/0237077A1 of Vaughan et al. (incorporated herein by reference in its entirety for all purposes) describes an RF coil system for MR applications that includes a multi-channel RF coil transceiver and a multi-channel RF coil. The RF coil system is structured for reconfiguration between a plurality of operational modes.

U.S. Patent Publication 2009/0264733A1 of Corum et al. (incorporated herein by reference in its entirety for all purposes) describes a positive contrast MRI feature using a high transverse relaxation rate contrast agent.

U.S. Pat. No. 6,495,069 issued 17 Dec. 2002 to Lussey et al. titled "Polymer composition," is incorporated herein by reference. Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 7,672,650 to Sorrells et al. issued 2 Mar. 2010 titled "Systems and methods of RF power transmission, modulation, and amplification, including multiple input single output (MISO) amplifier embodiments comprising harmonic control circuitry" and is incorporated herein by reference. Sorrells et al. describe methods and systems for vector combining power amplification. In one embodiment, signals are individually amplified, then summed to form a desired time-varying complex envelope signal. Phase and/or frequency characteristics of one or more of the signals are controlled to provide the desired phase, frequency, and/or amplitude characteristics of the desired time-varying complex envelope signal. In another embodiment, a time-varying complex envelope signal is decomposed into a plurality of constant envelope constituent signals. The constituent signals are amplified equally or substantially equally, and then summed to construct an amplified version of the original time-varying envelope signal. Embodiments also perform frequency up-conversion. However, neither operation in high fields nor operation where the control of the circuit is distal from the RF antennae, are discussed by Sorrells et al.

As used herein, an antenna (also called a coil element herein) is an electrically conductive elongate body that is connected to an electric circuit, and that (1) transmits (radiates) electromagnetic radiation (radio-frequency (RF) waves that propagate without a physical electrical conductor) corresponding to an alternating current (AC) radio-frequency signal from the circuit, wherein the transmitted RF waves propagate into the surrounding environment away from the coil element, and/or that (2) receives electromagnetic radiation (radio waves) from the environment and generates an AC radio-frequency electrical signal into the circuit. Coil elements can be simply a straight, bent, or coiled piece of metal wire or rod or pipe, or a similarly shaped conductor on an insulating substrate. There are a number of different types of antennae, including monopoles, dipoles, microstrips, striplines and slot antennae just to name a few, and various of these types of antennae can be formed into arrays (e.g., phased arrays) to customize the shape and strength of the resulting RF field. As used herein, an "RF-coil device" or an "antenna array" are equivalent terms for an array of coil elements (i.e., an array having a plurality of antennae). To clarify the distinction from an inductor (i.e., an inductor which typically includes a coil of wire for lower frequencies, and which is sometimes simply called a coil) that is not being used as an antenna, such inductors will be called herein "inductor coils" or simply "inductors". In some embodiments, the RF-coil device is an MR-RF-coil device that is configured to be used in a high-field MR machine (i.e., it is made of non-ferrous materials and is otherwise compatible with the magnetic and RF fields typically found in such machines) and forms an essential part of the MR machine (such as an MRI machine used to obtain images of structures inside the human body).

In conventional MR machines, there is less concern with compatibility of the high-power RF amplifiers to a high-magnetic-field environment because in conventional MR machines the high-power RF amplifiers are located in a control room, and are at a distance from the remote antenna array located in the magnet bore next to the patient.

There is a long-felt need for a more efficient and flexible way to transmit high-power RF signals from one or more antenna arrays in an MR machine while simultaneously receiving a signal into one or more antenna arrays in the MR machine and separating a net received signal from the received signal. This need also applies to other high-power RF-transmit-and-receive signals such as RADAR, cellphones and the like.

SUMMARY OF THE INVENTION

The present invention provides a more efficient and flexible way to obtain and connect high-power RF transmit signals (TX) to RF-coil devices in an MR machine and simultaneously receive signals (RX) and separate net receive signals NRX) of interest by subtracting a subtractable version of the transmit signal (STX) from the RX and preamplifying the NRX and signal processing the preamplified NRX. In some embodiments, the signal processing includes further removing artifacts of the transmitted signal, e.g., by digitizing the NRX signal, storing the digitized NRX signal in a memory, and performing digital signal processing. In some embodiments, the present invention also includes pre-distorting the TX signals in order to be better able to identify and/or remove the remaining artifacts of the transmitted signal from the NRX signal. This solution also applies to other high-power RF-transmit-antennae signals.

In some embodiments, the present invention includes combinations that also include the apparatus and methods described in co-owned U.S. patent application Ser. No. 12/879,000 titled "ACTIVE TRANSMIT ELEMENTS FOR MRI COILS AND OTHER ANTENNA DEVICES" filed 9 Sep. 2010 by John Thomas Vaughan, Jr. et al. (which issued as U.S. Pat. No. 8,604,791 on 10 Dec. 2013), which is incorporated herein by reference. These combinations provide the following additional advantages that are further enhanced by simultaneous transmit-receive:

fewer and lower-power power amplifiers can be used because the losses in the combiner and coaxial cable (frequently called just "coax") are avoided (this also reduces cost and reduces failure rates by eliminating the combiners and coaxial cabling), wireless connections (and/or much smaller gauge cabling) can be used for transmit signals, as well as for receive signals, since only low-power RF transmit signals and control signals need be sent from the control room to the RF-coil device in the magnet bore, the coil elements provide a convenient heat-sink platform for handling the waste heat of the power amplifiers, there is more room around the patient, reducing the claustrophobic feeling that otherwise results from the massive cabling otherwise needed, and locating the power amplifiers and/or the transmit/receive (T/R) switches in the coil enclosure provides increased flexibility in circuit layout and coil-element positioning, and allows additional functionality (such as automatic tuning and impedance matching) to be provided for the transmit circuitry and the T/R switching circuitry.

Other advantages will become apparent to those skilled in the art upon reading the following detailed description of various embodiments.

In some embodiments, the present invention uses RF signals having frequencies in the range of 50 MHz to 500 MHz. In MR machines of different magnetic-field strengths, different RF frequencies are used, wherein the frequency corresponds to a nuclear resonance at a given magnetic-field strength; for example 64 MHz is used for MRI machines having 1.5-Tesla magnets (these are used for most MR machine platforms in the world today), 128 MHz is used for MRI machines having 3-T magnets (currently the fastest-growing segment of the MR market), 300 MHz is used for MRI machines having 7-T magnets (considered the highest-field machines supported by industry today), 400 MHz is used for MRI machines having 9.4-T magnets (it is believed there are now only three in use in the world), and 450 MHz is used for the MRI machine having a 10.5-T magnet (currently, just the Center for Magnetic Resonance Research (CMRR) at the University of Minnesota operates one of these).

In some embodiments, the circuitry incorporated in the RF coil in the magnet bore further includes the RF oscillators needed for the transmit signals (TX and STX), and thus only control signals need be sent from the control room to the RF coil in the magnet bore, further reducing bandwidth requirements, and facilitating even wireless control of the RF transmit signals. In some embodiments, wireless transmission is also used for the signals received by and processed in the RF-coil device (i.e., wirelessly transmitting the NRX), and thus the only wiring needed in some embodiments is electrical-power cabling (e.g., in some embodiments, cabling for DC voltage and current) that is used to supply electrical power to the power amplifiers of the transmit stages, the T/R switches, and the pre-amplifiers of the receive stages.

BRIEF DESCRIPTION OF THE DRAWINGS

FIG. 1G is a block diagram of a simultaneous transmit-receive MRI system 107. In some embodiments, the portion 192 is implemented (as shown in FIG. 1B above) in or next to the bore 140 (e.g., in the housing of TX-RX coil 130).

FIG. 1H is a block diagram of a simultaneous transmit-receive MRI system 108. System 108 is much the same as system 102 described above.

FIG. 5A shows the waveforms of a control pulse used in some embodiments to obtain a PWM seed signal.

FIG. 5B shows the waveforms of an RF sine-wave seed signal and a gated higher-frequency triangle or saw-tooth wave use in some embodiments to obtain a PWM seed signal.

FIG. 5C shows the waveform of a PWM seed signal.

FIG. 5D shows the waveform of an amplified PWM signal.

FIG. 5E shows the waveform of a filtered amplified RF sine-wave signal.

FIG. 6 is a flowchart of a method 600 according to some embodiments of the invention.

FIG. 7 is a flowchart of a method 700 according to some embodiments of the invention.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1A:
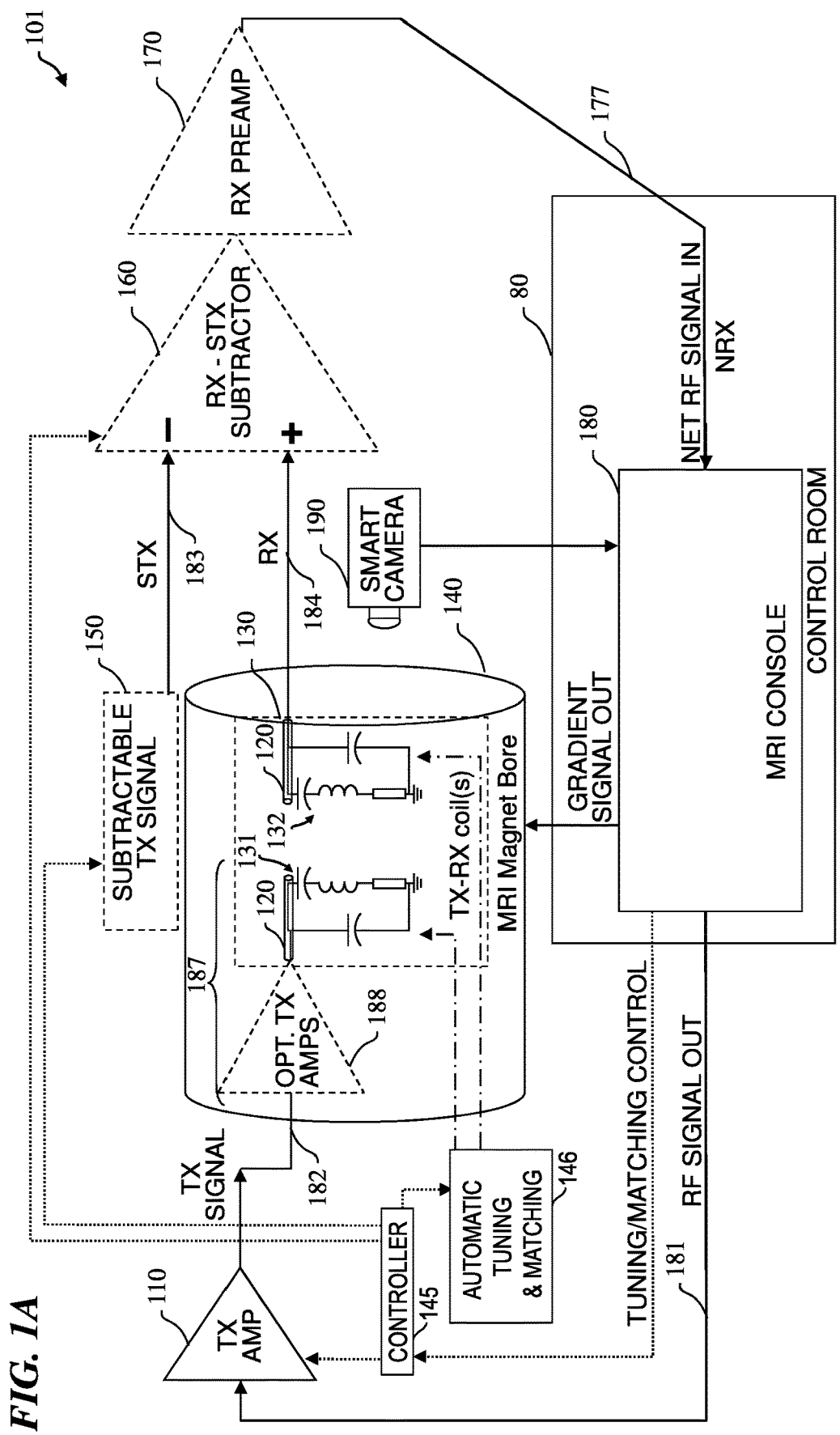
FIG. 1A is a block diagram of a simultaneous transmit-receive system 101 having a transmit-amplifier system (TX amp) 110 coupled to transmit antenna elements (TX coils 131) in a TX-RX coil system 130 and controlled from a remote control room 80, according to one embodiment of the present invention.

FIG. 1A is a block diagram of a simultaneous transmit-receive system 101 optionally including a distributed-power-amplifier subsystem 187 having an optional plurality of remote power amplifiers 188 connected to a plurality of remote antenna elements 120 (in some embodiments, modeled by the RLC (resistance-inductance-capacitance) elements of coil 131 as shown) and controlled from a distal control room 80, according to one embodiment of the present invention. In some embodiments, different ones of the plurality of antenna elements 120 are each driven by different versions of the TX signal 182 each having different phases and/or amplitudes in order to shape the transmitted RF field and/or match the frequency tuning and impedance matching of the transmitted signal to the object (e.g., the human patient in some embodiments) being examined. In some embodiments, another plurality of antenna elements 120 (in some embodiments, modeled by the RLC elements of coil 132 as shown) is used to receive RX signal 184 In some embodiments, the present invention provides a subtraction of an STX (subtract-the-transmit) signal 183 representing what would be received by receiving antenna 132 directly from transmit antenna 131, in order that the remaining signal going into RX preamp (receive pre-amplifier) 170 contains primarily the signal of interest (e.g., the magnetic resonance signal from a patient in an MRI machine).

In some embodiments, the present invention provides a subtraction of an STX (subtract-the-transmit) signal 183 representing what would be received by receiving antenna 132 directly from transmit antenna 131, in order that the remaining signal going into RX pre-amp (receive pre-amplifier) 170 contains primarily the signal of interest (e.g., the magnetic resonance signal from a patient in an MRI machine).

Figure 1B:
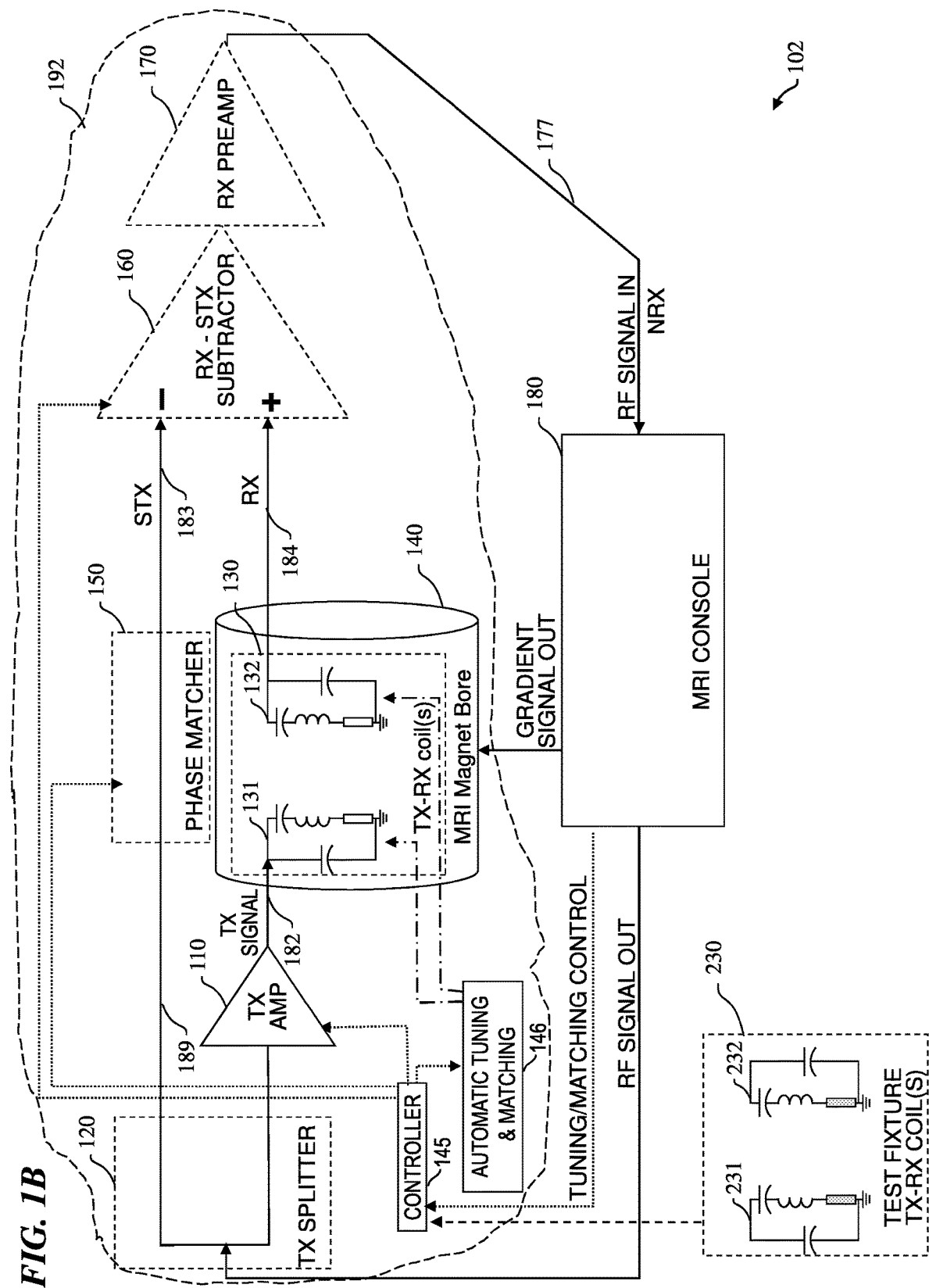
FIG. 1B is a block diagram of a simultaneous transmit-receive system 102 having a transmit-amplifier system (TX amp) 110 coupled to transmit antenna elements (TX coils 131) in a TX-RX coil system 130 and controlled from a remote MRI console 180, according to one embodiment of the present invention.

In some embodiments, the present invention provides an automatic adjustment of the STX subtract signal, including an adjustment of the phase and/or amplitude of the STX signal 183 based on detection of subject size and position, in order to predict or estimate what signal would be sensed from the transmit (TX) signal 182 and remove it from the received (RX) signal 182 before it reaches the preamp 170. In some embodiments, a subtract-signal algorithm and/or circuit 145 is provided for the adjusting circuitry 146 for changing (adjusting) the correction signal (e.g., in some embodiments, by changing the tune (frequency) and match (impedance) aspects of the coil(s) 131 and/or 132 so phase and amplitude in and the phase and amplitude out are the same all the time (in order that the residual transmit signal can be more effectively subtracted from the received signal 184 to leave only or primarily the signal of interest for the MR imaging and/or spectroscopy). In some embodiments, a model is generated beforehand, by placing the subject (e.g., patient) into coil 131-132 (or dummy coil 230 such as shown in FIG. 1B) early, for example in a pre-op (pre-operation) appointment. In some embodiments, the patient is placed in test fixture system 230 to determine signal-subtraction parameters (which are applied to generate STX signal 183 based on these parameters (and, in some embodiments, also based on the TX signal portion 189 (see, e.g., FIG. 1B) from signal splitter 120) to auto correct for patient's size and shape based on results from test fixture 230.

In some embodiments, a simultaneous transmit-receive system 101 is used as an RF portion of an MRI (nuclear-magnetic-resonance imaging) system. In some embodiments, an RX-STX subtractor 160 removes a subtractable portion of the transmit signal (STX, which in some embodiments, is obtained from a circuit 150) from the received signal RX obtained from receive antenna elements (RX coils 132) and the resulting signal is pre-amplified by RX preamp 170 to obtain a net received signal (NRX) 177, which is delivered to the MRI console 180. In some embodiments, circuit 150 generates STX by splitting signal from the TX signal, before or after TX amp 110, or in other embodiments, can be separately derived (e.g., by a local oscillator controlled by attributes of the RX signal, as is done in some radio receivers). In some embodiments, a controller 145 (e.g., in some embodiments, driven by tuning and matching control signals from MRI console 180) is used to control the TX amp 110, the STX signal generator 150, the RX-STX subtractor 160, and/or automatic tuning and matching system 146. In some embodiments, automatic tuning and matching system 146 is used to adjust resonance frequency, phase, and/or impedance of TX-RX coil system 130. In some embodiments, characteristics of the patient in the MRI machine (such as size, shape, tissue composition and the like) are used by the automatic tuning and matching system 146 to automatically adjust resonance frequency, phase, and/or impedance of TX-RX coil system 130 to match the patient. In some embodiments, the subtractable portion of the transmit signal (STX) is obtained by frequency-filtering the low-power RF (which, in conventional MRI systems, would include a carrier-frequency wave that is amplitude-modulated with square-wave-pulse) to remove certain frequency components in order to obtain RF signal out 181. For example, in conventional systems, the carrier-frequency wave is amplitude-modulated with one or more square-wave-pulses (e.g., to obtain a pulse sequence useful for obtaining, for example, spin-echo response signals). In some embodiments of the present invention, and frequency components of the resulting RF pulse having frequencies higher than the carrier frequency are removed, while the carrier frequency and frequencies lower than the carrier frequency are removed or substantially reduced) such that the RF signal out 181 transmitted signal has the carrier (e.g., Larmor) frequency and certain other frequencies needed to obtain the desired magnetization flips (e.g., a transmit signal sufficient to obtain a pi-rotation (similar to a pi-pulse in a spin-echo system) or other desired response, but which has little or no frequency components at the frequencies of the desired response signal. In other words, in some embodiments, the pulse sequence includes one or more excitation pulses, and is frequency filtered to remove certain frequencies and leave the carrier and other frequencies in the transmit TX signal, and the simultaneously received RX signal is filtered to remove the carrier and other frequencies that were left in the transmit TX signal, and thus leave only frequency components due to the response of the MR excited constituents. While the response of the MR excited constituents may have frequency components that are filtered out, those that are not filtered out are then used to reconstruct the response signal, in a manner similar in concept to reconstructing the transmitted information from a received a single-sideband signal that is missing the carrier and the other sideband signals.

In some such embodiments, a machine-vision (smart) camera 190 is used to determine some characteristics of the patient in the MRI machine (such as size, shape, position and the like). In other embodiments, (or additionally) automatic tuning and matching system 146 uses parameters derived from the TX signal (such as impedance or signal reflection) and/or the RX signal (such as the amount of residual TX signal that is in the RX signal) to adjust positions and/or resonance frequency, phase, and/or impedance of TX-RX coil system 130 to enhance isolation between the TX coils 131 and the RX coils 132.

FIG. 1B is a block diagram of a simultaneous transmit-receive system 102 having a transmit-amplifier system (TX amp) 110 coupled to transmit antenna elements (TX coils 131) in a TX-RX coil system 130 and controlled from a remote MRI console 180, according to one embodiment of the present invention. In some embodiments, the system 102 of FIG. 1B is substantially similar to system 101 of FIG. 1A, except that the controller 145 receives input parameters from a test-coil system 230 (which includes a transmit coil 231 and receive coil 232) into which the patient is placed (before the MRI procedures in system 192) in order to obtain parameters useful for frequency tuning and impedance matching The received RF signals 84 from RX coils 132 again go to the subtractor circuit 160 and preamp 170 to generate NRX signals 177, which are then processed in a conventional manner to obtain the spectroscopy or image data.

In some embodiments, simultaneous transmit-receive system 102 is used in an MRI system. In some such embodiments, system 102 has a transmit-amplifier system (TX amp) 110 coupled to transmit antenna elements (TX coils 131) in a TX-RX coil system 130 and is controlled from a remote MRI console 180. In some embodiments, a RF signal out from the MRI console 180 is split by TX splitter 120 located before the TX amp 110, with a first portion being coupled to the input of TX amp 110, and a second portion being coupled through phase matcher 150 to form the STX signal into one input of the RX-STX subtractor 160. In some embodiments, the portion 192 is implemented in or next to the bore 140 (e.g., in the housing of TX-RX coil 130).

In some embodiments (see FIG. 1B), various characteristics of the patient (such as size, shape, tissue composition and the like) are determined by measuring such characteristics in a test machine 230 or fixture in a pre-operation procedure carried out before the patient is introduced into the MRI system 102. In some such embodiments, a test RC coil 231 and a test RX coil 232 are driven and analyzed by RF electronics to determine the appropriate phase and gain characteristics and the like to be applied and controlled by controller 145 in order to maintain frequency and impedance matching as well as TX to RX isolation when the same patient is placed in the actual MRI coils 131 and 132 in the MRI system 102. These characteristics are used to preset various initial conditions (such as signal amplitude, phase, and the area that is being transmitted into) of the TX amp 110 and RX-TX coils 130. In other embodiments, various characteristics of the patient (such as size, shape, position, breathing, heartbeat, tissue composition and the like, as well as the patient's position within the MRI magnet bore 140) are dynamically determined by measuring such characteristics of the patient in the MRI system 101 (see FIG. 1A) using, e.g., machine-vision camera 190, a breathing monitor, and/or an electrocardiogram (EKG) machine, and these characteristics are used to dynamically adjust frequency, spatial power (e.g., which TX elements of a multi-transmit coil are activated (and with what phase and gain) to apply transmit power primarily to a subset of the volume within the coil in order to have the right amount, polarization and phase of the TX power applied to the patient) and/or impedance characteristics of the TX amp 110, TX-RX coils 130, and/or RX-STX subtractor 160 in order to improve signal-to-noise ratios (SNR) of the net received signal NRX 177. In some embodiments, these characteristics are also stored along with the digitized NRX data.

Figure 1C:
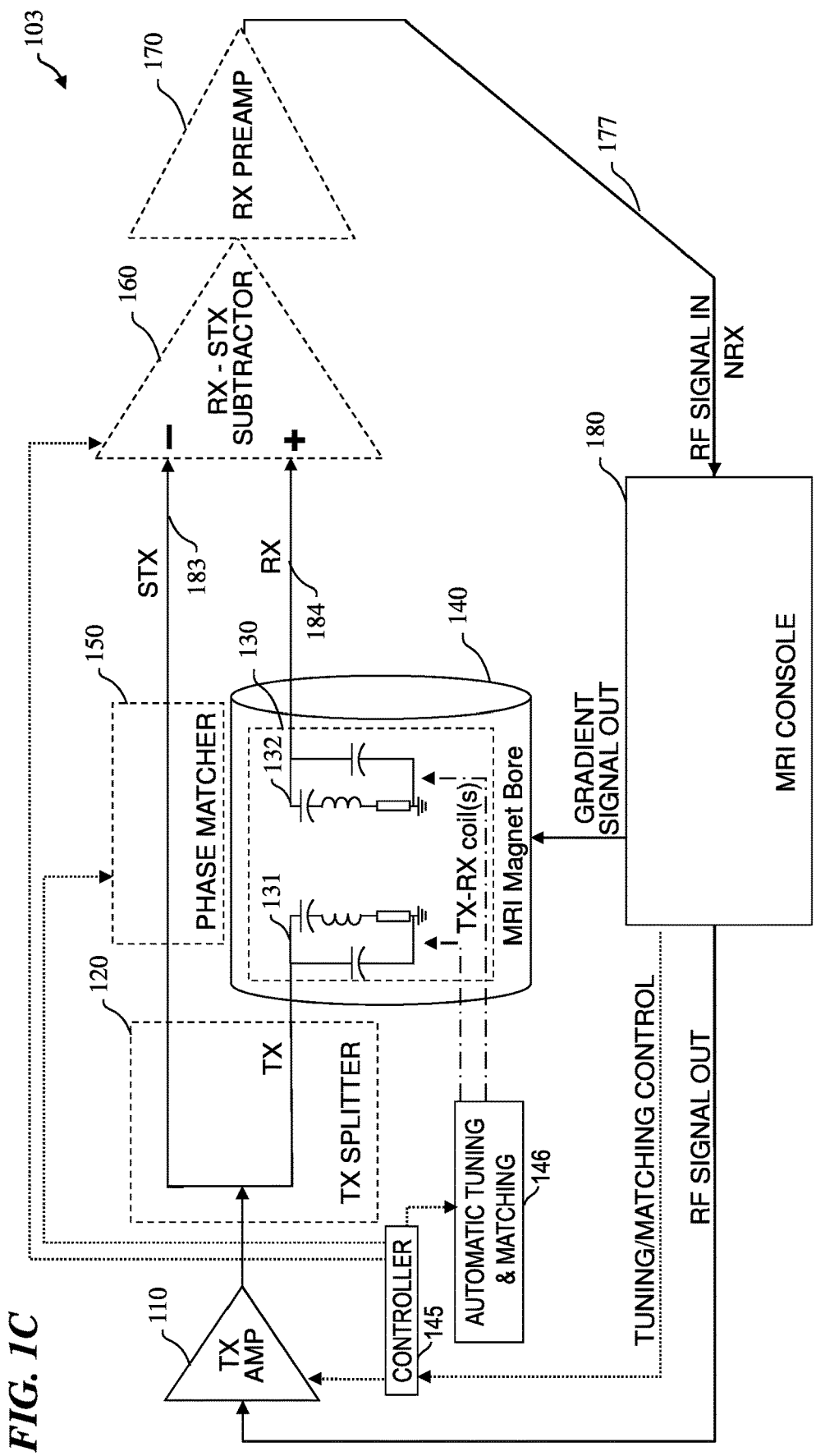
FIG. 1C is a block diagram of a simultaneous transmit-receive system 103 having a transmit-amplifier system (TX amp) 110 coupled to transmit antenna elements (TX coils 131) in a TX-RX coil system 130 and controlled from a remote MRI console 180, according to one embodiment of the present invention.

FIG. 1C is a block diagram of a simultaneous transmit-receive system 103 is used in an MRI system. In some such embodiments, system 103 has a transmit-amplifier system (TX amp) 110 coupled to transmit antenna elements (TX coils 131) in a TX-RX coil system 130 and controlled from a remote MRI console 180, according to one embodiment of the present invention. In some embodiments, a RF signal out from the MRI console 180 is split by TX splitter 120 located after the TX amp 110, with a first portion being coupled to the input of TX amp 110, and a second portion being coupled through phase matcher 150 to form the STX signal into one input of the RX-STX subtractor 160. In some embodiments, other aspects of system 103 are as described above for systems 101 and 102. In some embodiments, the automatic tuning and matching of unit 146 (see FIG. 1A) is implemented using a piezo motor 140 coupled to a reference spatial location 143, and operating a mechanical arm of a dielectric material 141, as described in U.S. patent application Ser. No. 12/719,841 by Carl Snyder et al., which is incorporated herein by reference. In some embodiments, a power supply 105 provides the electrical power to the push-pull output stage 130, while RF driver circuit 109 provides the drive signals. Other aspects are as described above.

Figure 1D:
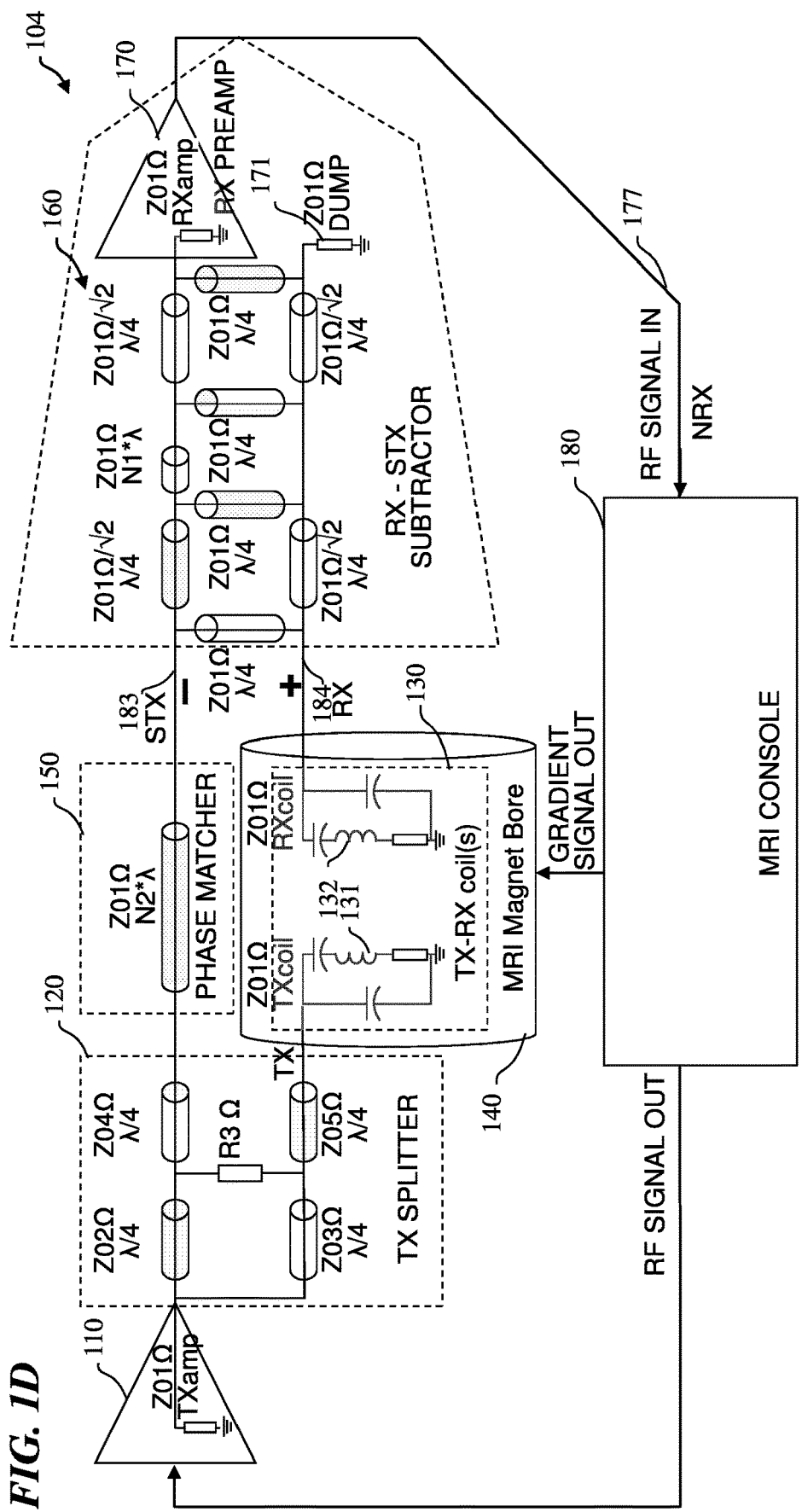
FIG. 1D is a block and schematic diagram of a simultaneous transmit-receive system 104 having a transmit-amplifier system (TX amp) 110 coupled to transmit antenna elements (TX coils 131) in a TX-RX coil system 130 and controlled from a remote console 180, according to one embodiment of the present invention.

FIG. 1D is a block and schematic diagram of a simultaneous transmit-receive system 104 is used in an MRI system. In some such embodiments, system 104 has a transmit-amplifier system (TX amp) 110 coupled to transmit antenna elements (TX coils 131) in a TX-RX coil system 130 and controlled from a remote MRI console 180, according to one embodiment of the present invention. In some embodiments, a RF signal out from the MRI console 180 is split by TX splitter 120 located after the TX amp 110, with a first portion being coupled to the input of TX coil 131, and a second portion being coupled through phase matcher 150 to form the STX signal into one input of the RX-STX subtractor 160. In some embodiments, the TX amp has a characteristic output impedance at its frequency of operation (denoted here as Z01 ohms), which matches the input impedance of splitter network 120. In some such embodiments, splitter network 120 includes four quarter-wavelength sections of transmission line (e.g., in some embodiments, coax cable), each having a characteristic impedance at its frequency of operation (denoted here as Z02 ohms, Z03 ohms, Z04 ohms, Z05 ohms) and arranged in an H network having a middle resistor having a resistance (denoted here as R3 ohms). In some embodiments, the vast majority of the signal from TX amp 110 is fed as transmit signal TX to the transmit coil 131, which has a characteristic impedance at its frequency of operation (denoted here as Z01 ohms, the same characteristic impedance as the TX amp 110); while the remaining minority of the signal is fed through a length of transmission line 150 having a characteristic impedance at its frequency of operation (denoted here as Z01 ohms, the same characteristic impedance as the TX amp 110) and a signal length of a calculated fractional multiple of the wavelength of operation (denoted here as N2 times λ (the wavelength of operation), in order that the resulting subtractable portion of the transmit signal (STX) will be aligned in time or phase but inverted in magnitude with the portion of the TX signal that is received by the RX coil 132, wherein RX coil 132 has a characteristic impedance at its frequency of operation (denoted here as Z01 ohms, the same characteristic impedance as the TX amp 110). In some embodiments, RX-STX subtractor 160 comprises two square transmission line couplers that each have an upper and lower series leg having a characteristic impedance at its frequency of operation (denoted here as Z01 divided by the square root of two ohms, and a signal phase length of λ/4 (one quarter of the wavelength of operation)), and a left and right parallel leg having a characteristic impedance at its frequency of operation (denoted here as Z01, and a signal phase length of λ/4 (one quarter of the wavelength of operation)). Between the two square combiners, one of the legs has a transmission line having a characteristic impedance at its frequency of operation (denoted here as Z01), and a signal phase length of a different constant N1 times the wavelength of operation (N1λ). By adjusting the phase delays N2λ of the phase matcher 150 and N1λ between the two combiners of RX-STX subtractor 160, almost all of the unwanted transmit signal of the RX signal from the RX coil 132 and almost all of the STX signal are coupled into dump resistor 171 (which has a characteristic impedance at its frequency of operation (denoted here as Z01)), while almost all of the received signal of interest (the received signal from the magnetic resonance signals from the patient) is coupled into RX amp 170. The net received signal NRX 177 from the output of RX amp 170 is then coupled (e.g., by coax transmission line, optical fiber or wirelessly) to MRI console 180 to there be processed into MR images, MR spectroscopic signals or other diagnostic information.

Figure 1E:
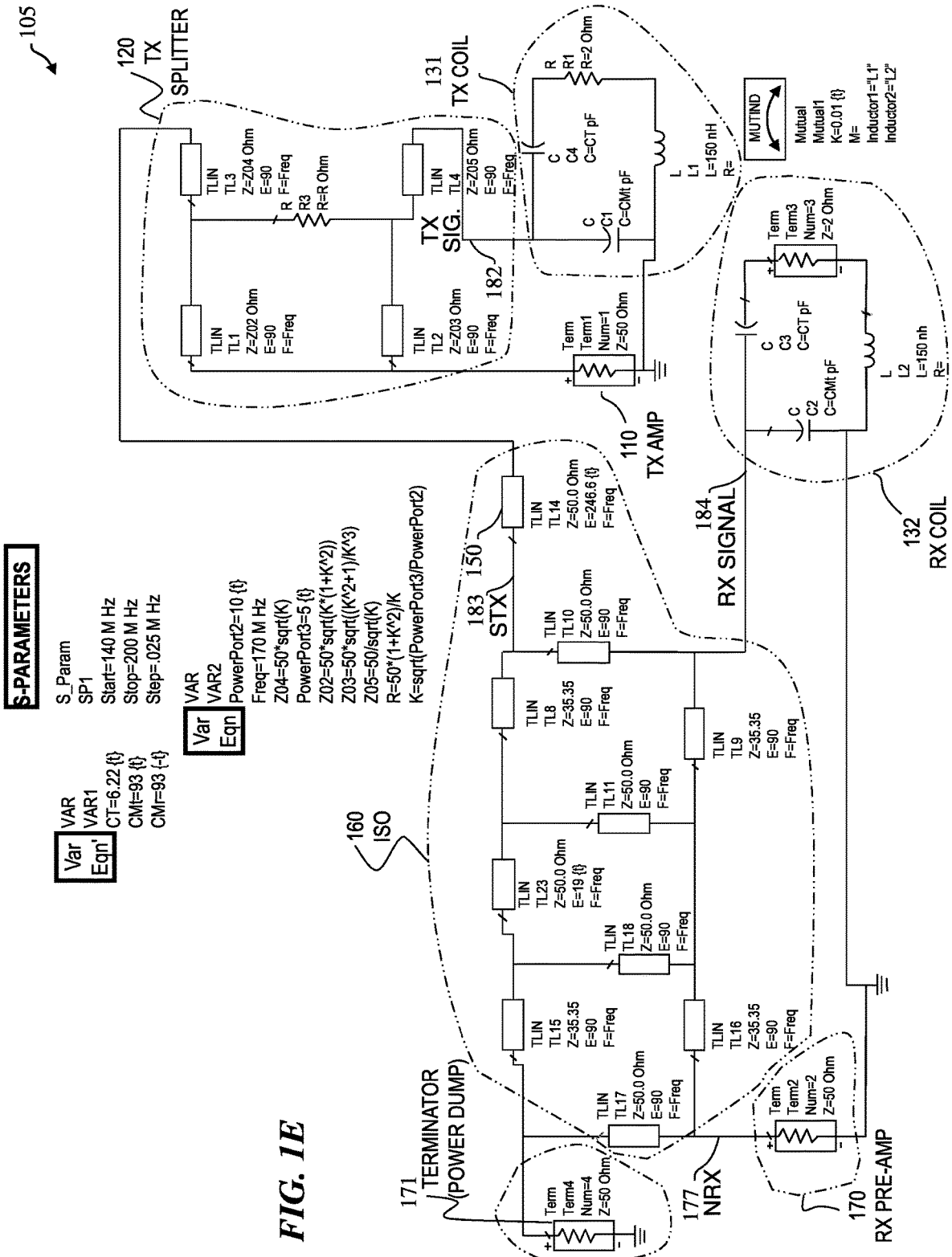
FIG. 1E is a block diagram of a simulation of a simultaneous transmit-receive MRI system 105, where each element is shown as its characteristic impedance and wavelength. In some embodiments, transmit-amplifier system (TX amp) 110 is shown as its output impedance (e.g., in some embodiments, 50 ohms) coupled to transmit antenna elements (TX coil 131 having two capacitances, a resistance and an inductance).

FIG. 1E is a block diagram for simulation of a simultaneous transmit-receive MRI system 105, where each element is shown as its characteristic impedance and wavelength. In some embodiments, transmit-amplifier system (TX amp) 110 is shown as its output impedance (e.g., in some embodiments, 50 ohms) coupled to transmit antenna elements (TX coil 131 having two capacitances, a resistance and an inductance). In some embodiments, the RF signal is split by TX splitter 120 located after the TX amp 110, with a first portion being coupled to the input of TX coil 131, and a second portion being coupled through phase matcher 150 to form the STX signal into one input of the RX-STX subtractor 160. In some embodiments, the TX amp 110 has a characteristic output impedance at its frequency of operation (wherein, for the example here, Z01 is 50 ohms), which matches the input impedance of splitter network 120. Here (as is the case in FIG. 1D), splitter network 120 includes four quarter-wavelength sections of transmission line (e.g., in some embodiments, coax cable), each having a characteristic impedance at its frequency of operation (denoted here as Z02 ohms, Z03 ohms, Z04 ohms, Z05 ohms) and arranged in an H network having a middle resistor having a resistance (denoted here as R3 ohms). In some embodiments, the vast majority of the signal from TX amp 110 is fed as transmit signal TX to the transmit coil 131, which has a characteristic impedance at its frequency of operation (here, 50 ohms, the same characteristic impedance as the TX amp 110); while the remaining minority of the signal is fed through a length of transmission line 150 having a characteristic impedance at its frequency of operation (here, 50 ohms) and a signal length of a calculated fractional multiple of the wavelength of operation (in the example here N2=246.6 degrees (246.6/360 times λ), in order that the resulting subtractable portion of the transmit signal (STX) will be aligned in time or phase but inverted in magnitude with the portion of the TX signal that is received by the RX coil 132, wherein RX coil 132 has a characteristic impedance at its frequency of operation (here, 50 ohms). In some embodiments, RX-STX subtractor 160 comprises two square transmission line couplers that each have an upper and lower series leg having a characteristic impedance at its frequency of operation (here, 50 ohms divided by the square root of two ohms), and a signal phase length of λ/4, and a left and right parallel leg having a characteristic impedance at its frequency of operation (here, 50 ohms), and a signal phase length of λ/4. Between the two square combiners, one of the legs has a transmission line has a characteristic impedance at its frequency of operation (here, 50 ohms), and a signal phase length of a different constant N1 times the wavelength of operation (N1λ). By adjusting the phase delays N2λ of the phase matcher 150 and N1λ between the two combiners of RX-STX subtractor 160, almost all of the unwanted transmit signal of the RX signal from the RX coil 132 and almost all of the STX signal are coupled into dump resistor 171 (which has a characteristic impedance at its frequency of operation (here, 50 ohms)), while almost all of the received signal of interest (the received signal from the magnetic resonance signals from the patient) is coupled into RX amp 170 (which has a characteristic impedance at its frequency of operation (here, 50 ohms)).

Figure 1F:
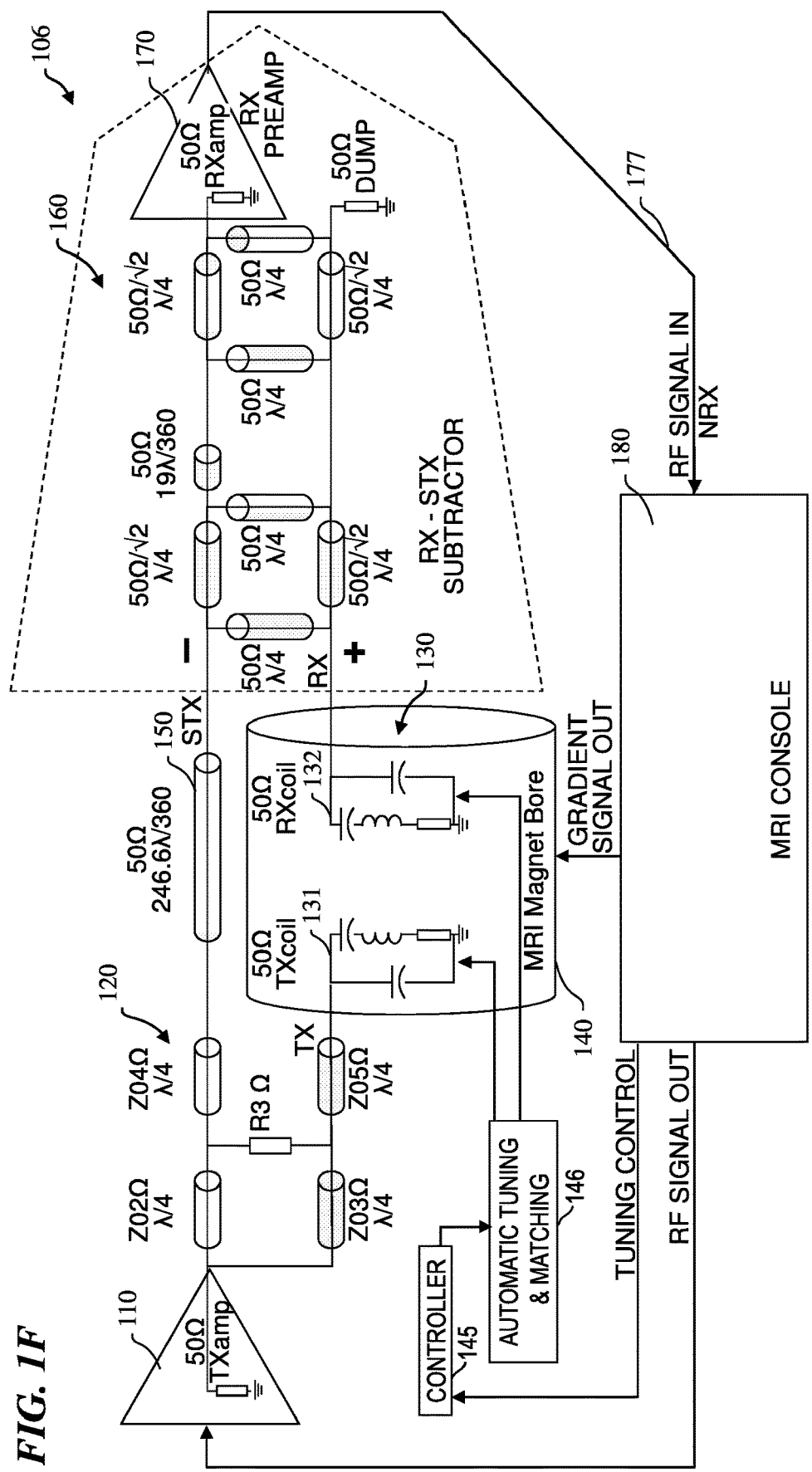
FIG. 1F is a block diagram of a simultaneous transmit-receive MRI system 106, where each element is shown as its characteristic impedance and wavelength.

FIG. 1F is a block diagram for a simultaneous transmit-receive MRI system 106, where each element is shown as its characteristic impedance and wavelength. System 106 is much the same, and has the same characteristic impedance at its frequency of operation (here, 50 ohms) as system 105 described above. In some embodiments, automatic and dynamic tuning control of the resonance frequency and impedance of the TX coil 131 and RX coil 132 is done by automatic tuning and matching circuit 146 under the control of controller 145 and/or MRI console electronics 180. In some embodiments, other aspects of systems 104, 105 and 106 are as described above for systems 101 and 102 and 103.

FIG. 1G is a block diagram for a simultaneous transmit-receive MRI system 107. In some embodiments, the portion 192 is implemented (as shown in FIG. 1B above) in or next to the bore 140 (e.g., in the housing of TX-RX coil 130). In some embodiments, automatic and dynamic tuning control of the resonance frequency and impedance of the TX-RX coils 130 is done by automatic tuning and matching circuit 146 under the control of controller 145 and/or MRI console electronics 180. In some embodiments, the NRX signal 177 is transmitted back to a wired or wireless receiver 89, and is digitized (either before being transmitted by subsystem 192 or after being received by received 89) and is stored as a digitized net received signal (DNRX) 277 in a digital memory. Similarly a digitized subtractive transmit signal representation (DSTX) 278 is also stored in a digital memory. DSTX 278 includes the time-varying characteristics of the transmit signal, which are determined during the MRI process, in order to be used by a post-processing RX-STX digital signal processor (DSP) subtractor 260 to further remove residual TX artifacts from the digitized net received signal (DNRX) 277. In some embodiments, the TX signal is pre-distorted in a known manner in order to be able to more easily identify and/or remove the residual TX artifacts using digital post-reception signal processing.

FIG. 1H is a block diagram for a simultaneous transmit-receive MRI system 108. System 108 is much the same as system 102 described above. In some embodiments, TX coil 131 transmits an MRI excitation pulse sequence and RX coil 132 receives the spin signal from patient 90. A signal source 121 provides the low-power input signal to high-power TX amp 110 that drives TX coils 131, and also provides the low power input signal to low-power decoupling amp 111 that drives the subtractive version of TX into the combiner-subtractor unit 160, which removes the TX artifacts from the RX signal and generates the NRX signal input to the RX preamplifier 170.

Figure 2A:
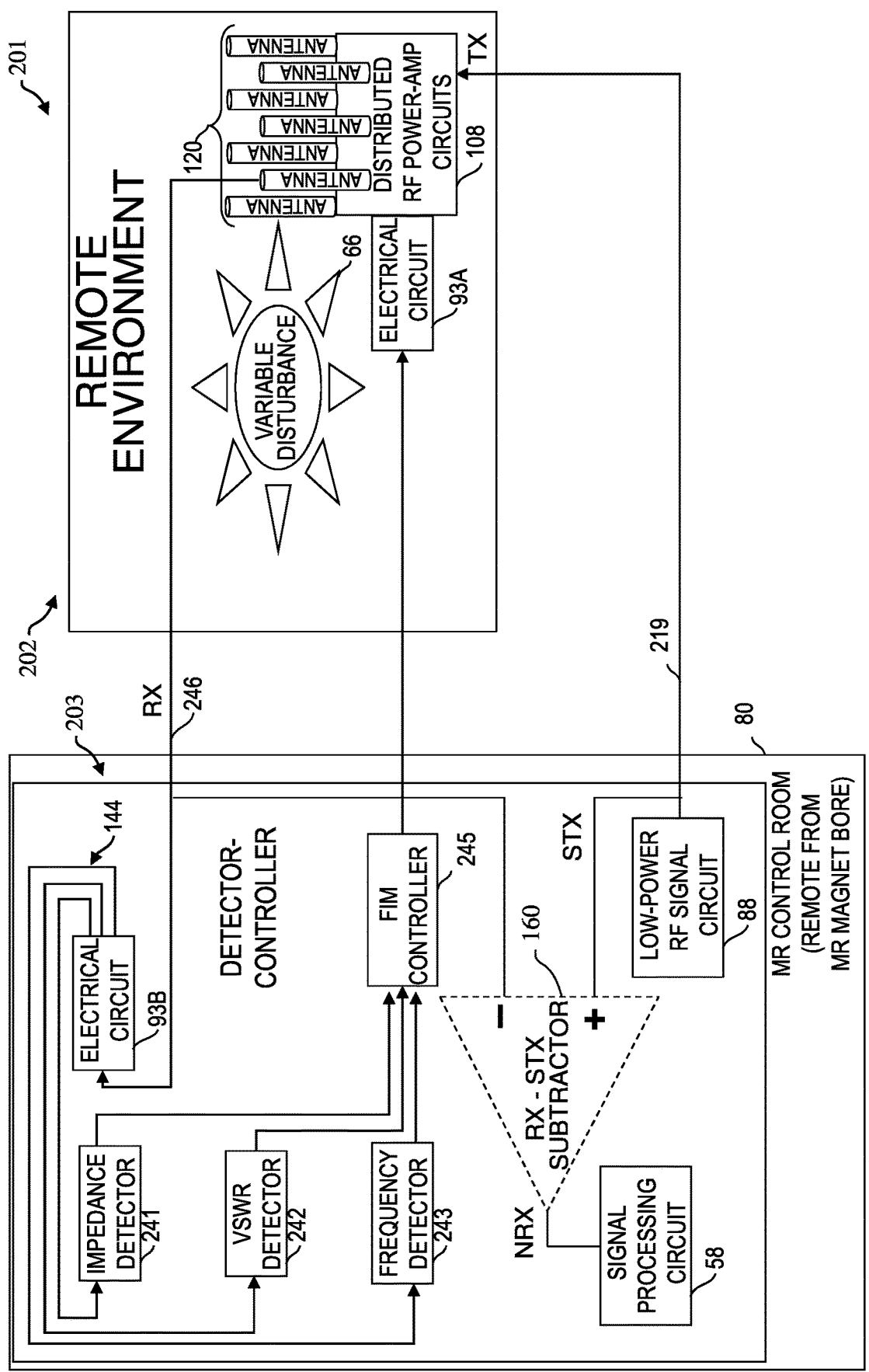
FIG. 2A is a block diagram of an entire system 201 according to one embodiment of the present invention, wherein variable electrical components of circuits are controlled to parameters set by detector-controller 203.

FIG. 2A is a block diagram of an entire system 201 according to one embodiment of the present invention, wherein variable electrical components of circuits 93A and/or 93B are controlled to values set by controller 245. In some embodiments, the frequency-impedance-matching (FIM) circuit has two portions, a first portion 93A that is remote (i.e., located at a distance, e.g., in the high-field magnet located at a distance from the control room of an MRI system) from a second portion 93B (e.g., the portion located in the control room 80). In some embodiments, remote circuit portion 93A is coupled to circuit portion 93B by a transmission line 219 (having a characteristic impedance Z at a given operating frequency or spectrum) such as a coaxial cable. In conventional systems, the frequency and impedance of the remote antenna array would need to be matched to the impedance of the coax cable 219. However, in some embodiments of the present invention, the remote distributed amplifier 108 provides a buffer, wherein the signal coming from the distal control room 80 and through the cable 219 sees only the input impedance of the amplifier and the effect of the variable disturbance on that impedance is negligible or substantially zero. Thus, even in embodiments having the RF-transmit signal generated in the distal control room 80, there is less of a requirement to match impedance of the coax cable 219 due to changes in the variable disturbance (e.g., the variations of patient weight, size, or composition). Further, in some embodiments, the signal sent across cable 219 is a duty-cycle-modulated (DCM) signal (in some embodiments, the DCM signal is a pulse-width-modulated (PWM) signal, while in other embodiments, pulses having a substantially unchanging pulse width but having a variable frequency, or other DCM characteristic are used). In still other embodiments, the signals on cable 219 include relatively low-frequency control signals (e.g., digital pulses that control the timing and duration of the transmitted RF pulses and the switching operations that control reception of the resulting RF response from the subject in the MR magnet, for example that control operation of an RF oscillator and pulse generator that are both in the remote device 202, and switching PIN-diodes that isolate the RF-reception preamps of the receive portion of the remote device 202).

In some embodiments, controller 203 is well outside of the remote environment 202 (such as a high-magnetic-field enclosure, or a broadcast television antenna on a tower, or a remote weather sensor) that includes circuit portion 93A and its RLC components controlled by a piezo motor and/or a controller rod connected to the piezo motor. In other embodiments, both portions 93A and 93B of the circuit (which includes both circuit portions 93A and 93B, as well as the FIM controller 245 and its impedance detector 241, VSWR detector 242, and frequency detector 243) are in the remote location in device 202. In some embodiments, at least some of detector-controller 203 is implemented in the remote environment 202. In contrast, in the embodiment shown, one or more detectors (e.g., impedance detector 241, voltage standing wave detector 242, frequency detector 243) and the frequency-impedance matcher (FIM) 245 are located in the local environment 203 rather than in the remote environment 202. In either scenario, the FIM controller 245 provides the control signals that vary the antenna length(s) of antenna 120 and/or the variable R, L, and/or C values in circuit 93A, in order to match the desired resonance frequency of the RF transmitter to the desired transmit frequency (which, in some embodiments, is determined by the PWM signal that is Class-D amplified and filtered to form the RF transmit pulse). In some embodiments, electrical circuit 93B includes a radio-wave transmitter, receiver, or both (including the distributed power amplifier circuits 108 and antennae 120).

One use of the present invention is to provide remote amplification of the transmit RF pulse (e.g., a plurality of cycles of an RF signal gated by a signal that determines the length of the pulse (i.e., how many RF cycles are transmitted)) and to balance (match the resonance frequency and impedance) an RLC circuit (that includes antenna elements) wherein the inductance and/or capacitance parameters of at least a portion of the RLC circuit is affected by an external and variable disturbance 66 such as weather conditions or a conductive and/or dielectric body (e.g., such as when the frequency and/or impedance in relation to a transmission-line-signal connection of the circuit must be maintained for optimal performance, but the environment changes over time), wherein the variable disturbance 66 must be accommodated by changing the variable inductor and/or the variable capacitor. Accordingly, in some embodiments, an impedance-mismatch detector 241 and/or a voltage-standing-wave-ratio (VSWR) detector 242 are used to determine whether and how to modify the values of the inductance and capacitance in order to rebalance the impedance. For example, if circuit portion 93A has power amplifier output stages 108 each having a characteristic impedance $Z_0$ and a characteristic frequency $F_0$, and transmit antenna elements 120 each have the same characteristic impedance $Z_0$, then the transmit circuit would be considered balanced. Similarly if the receive-preamplifier input stages 109 each have a characteristic impedance $Z_0$ and a characteristic resonance frequency $F_0$, and receive antenna elements 120 each have the same characteristic impedance $Z_0$, then the receive circuit would be considered balanced. In some embodiments, the characteristic RLC values also determine a characteristic frequency $F_0$ or characteristic $Q_0$ (the quality of a resonant circuit). If then the variable disturbance 66 modifies the characteristic impedance of circuit portion 93A to a changed characteristic impedance $Z_0+\Delta Z$, then impedance-mismatch detector 241 and/or a voltage-standing-wave-ratio detector 242 would detect the change, and they send signal(s) to motor controller 245, which causes a motor to modify the variable portion(s) of capacitance and/or inductance to rebalance the impedances of each portion. If then the variable disturbance 66 changes and modifies the characteristic frequency $F_0$ or characteristic $Q_0$ of circuit portion 93A (by changing an RLC parameter) combined with circuit portion 93B to a changed characteristic frequency $F_0+\Delta F$ or characteristic $Q_0+\Delta Q$, then frequency detector 243 and/or a Q detector (not shown) would detect the change, and they send signal(s) to motor controller 245, which causes one or more motors to modify the variable portion(s) of capacitance and/or inductance to reset the frequency and/or Q of each portion.

In some embodiments, each of the components including the power amplifier 108 within remote environment 202 is made of materials that do not contain combinations of iron, nickel, cobalt, or the like that may be moved (physically displaced) by the high field, in order that the high field does not move these components.

In some embodiments, all or the relevant components including the distributed power amplifiers are in a single location, and the present invention is used to adjust component parameters to compensate for some environmental change or a change in the physical surroundings of the circuit that affected any of the RLC parameters. For example, the mere presence of a person or other modality (that might be used to tune some aspect of a circuit) might adversely affect a resistance, inductance or capacitance. In those cases, some embodiments of the invention facilitate the adjustment of the resistance, inductance or capacitance values without a person needing to be in the vicinity. As another example, some circuits may need to be tuned to have a certain resistance, inductance and capacitance in the presence of a person (where a person in the vicinity changes these parameters by their presence, or due to physical or physiological motion (e.g., breathing, heart beating, gastrointestinal movement, and the like) by the person), but the position, body composition and size of the person is unknown and must be compensated for, and some embodiments of the invention facilitate the adjustment of the resistance, inductance or capacitance values to automatically compensate for those characteristics of the person in the vicinity. In some embodiments, conventional magnet-based motors or electric-field based motors themselves would have an undesired effect on the resistance, inductance and capacitance of a sensitive circuit (or such motors could themselves be adversely affected by high magnetic or electric fields), so piezo-electric motors as described herein have the advantage of not interacting (or interacting very little) with the resistance, inductance and capacitance being adjusted.

Figure 2B:
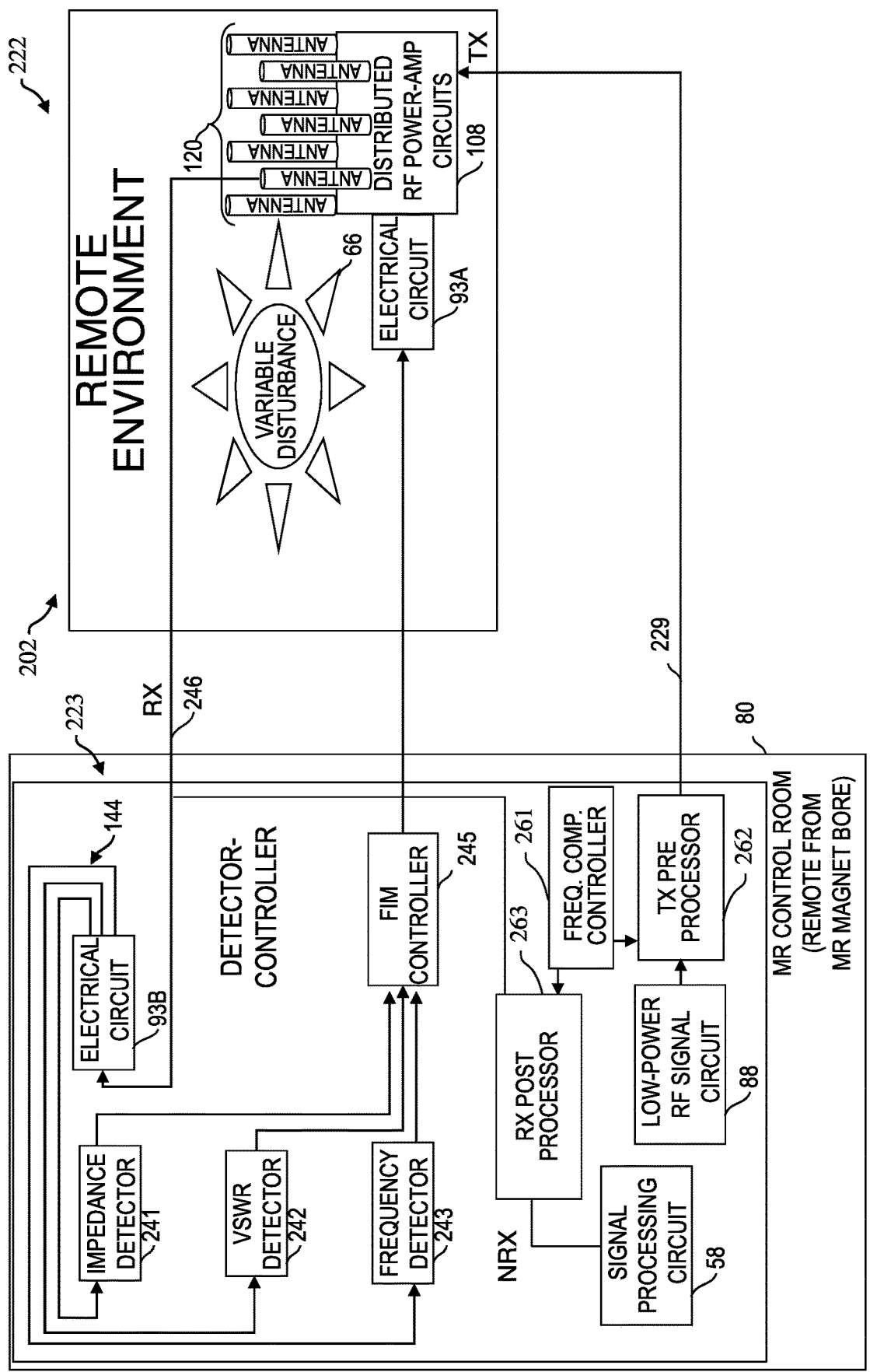
FIG. 2B is a block diagram of an entire system 222 according to one embodiment of the present invention, wherein variable electrical components of circuits are controlled to parameters set by detector-controller 223.

FIG. 2B is a block diagram of an entire system 222 according to one embodiment of the present invention, wherein variable electrical components of circuits are controlled to parameters set by detector-controller 223. In some embodiments, detector-controller 223 obtains RF pulse-sequence (PS) signals (e.g., a series of pulses of an RF carrier-frequency wave) from low-power RF signal circuit 88, and preprocesses the RF PS signals with TX preprocessor 262 under control of frequency-component controller 261 (e.g., by filtering to remove certain frequency components, and/or phase shifting or other forms of emphasizing signal components that will excite the magnetic resonance responses desired in the object or patient being examined, while removing signal components from the transmitted signal that would be the expected response signal from the object or patient being examined) to generate pre-processed transmit signal 229. For example, in some embodiments, a comb filter, surface-acoustic-wave (SAW) filter or other suitable filter is used as part of the TX preprocessor 262 to form a filter that removes every other one (e.g., odd-numbered ones) of a plurality of regularly spaced frequency components while passing the other frequency components (e.g., even-numbered ones, thus forming an amplitude-versus-frequency response curve that looks like a comb). Comb filters are well known by persons of skill in the art. In some embodiments, the comb filter in the TX preprocessor 262 is selected to leave the carrier frequency, which is selected to be preferentially absorbed by the atoms or molecules being examined at the magnetic-field intensity of the MR magnet (i.e., the Larmor frequency).

Figures 3A, 3B:
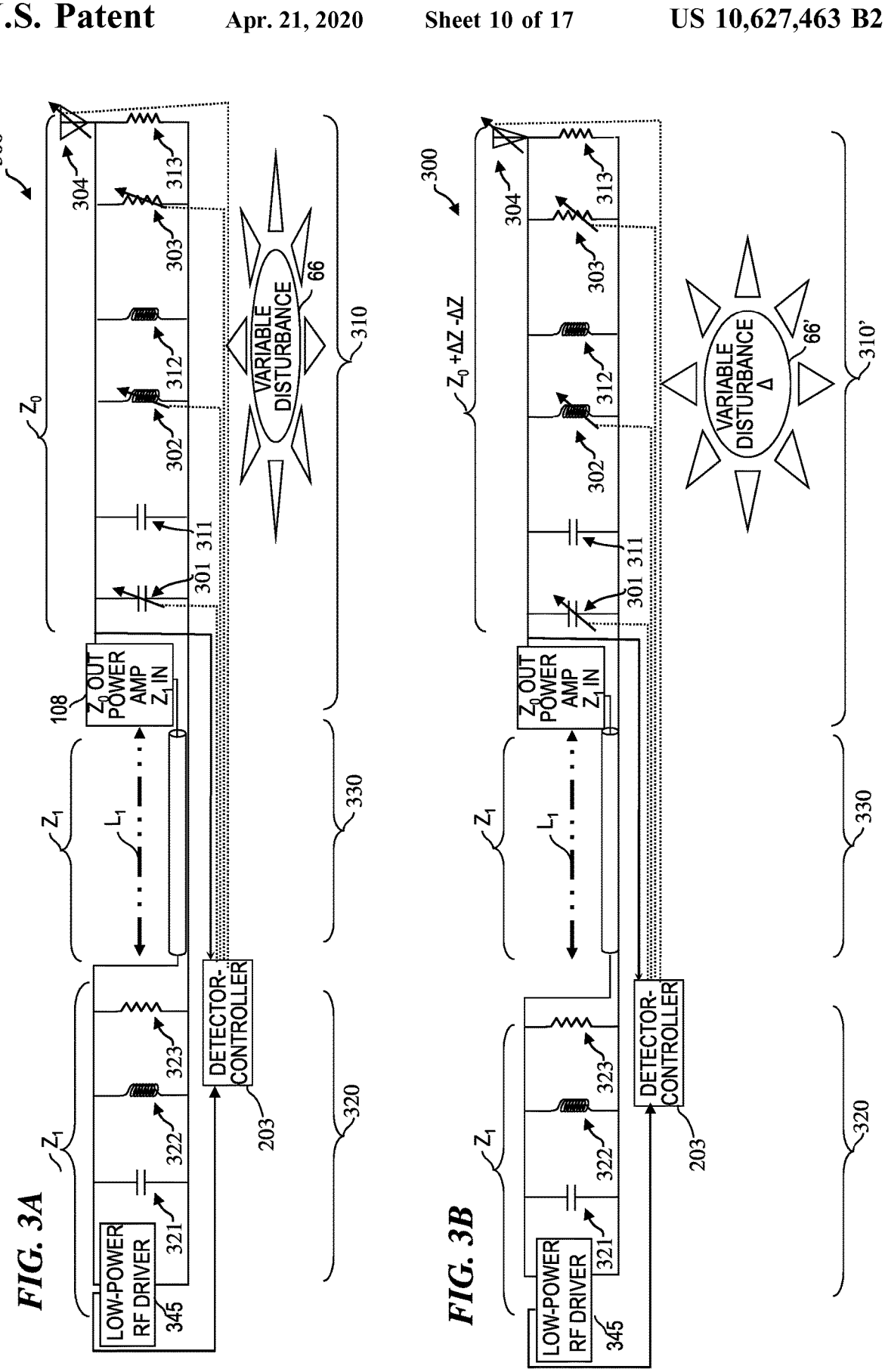
FIG. 3A is a block diagram of an impedance-matched high-frequency circuit 300 according to one embodiment of the present invention, and having an external impedance disturbance 66 having a first effect on circuit 301.
FIG. 3B is a block diagram of impedance-matched high-frequency circuit 300 of FIG. 3A, and having a different external impedance disturbance 66' having a second effect on circuit 300.

FIG. 3A is a block diagram of an impedance-matched high-frequency circuit 300 according to one embodiment of the present invention, and having an external impedance disturbance 66 having a first effect on circuit 300. In some embodiments, a driver circuit 320 has a characteristic impedance $Z_1$ composed of (or modeled by) an equivalent capacitance 321, equivalent inductance 322, equivalent resistance 323, and ideal voltage source driver 345 (which outputs a voltage signal having one or more frequency components and optionally a DC component, but is modeled as having a very high or infinite impedance such that its impedance does not affect the circuit). In other embodiments, ideal voltage source driver 345 is replaced by an ideal voltage sensor or transceiver (transmitter-receiver combination) (having a very high or infinite impedance such that its impedance does not affect the circuit). Of course, in other embodiments, the parallel connection of equivalent capacitance 321, equivalent inductance 322, equivalent resistance 323 and low-power RF driver voltage source 345 can be replaced with a series-wired connection of a capacitance, inductance, resistance and an ideal current source (and/or ideal current detector, each having zero or negligible impedance) that can provide the same characteristic impedance $Z_1$. Driver circuit 320 is electrically coupled to a transmission line segment 330 (i.e., of transmission line 219 as shown in the other various Figures herein) also having the characteristic impedance $Z_1$ at the respective frequencies of interest in the signal, and transmission line segment 330 is in turn electrically coupled to the input port (also having the characteristic impedance $Z_1$ at the respective frequencies of interest in the signal) of a remote amplifier 108 whose output (having a characteristic impedance $Z_0$ at the respective frequencies of interest in the signal) is connected to a tuned circuit 310, which, in some embodiments, includes an equivalent capacitance (that includes a fixed capacitance component 311 and a variable capacitance component 301 that can be tuned as described in U.S. patent application Ser. No. 12/719,841 titled "REMOTELY ADJUSTABLE REACTIVE AND RESISTIVE ELECTRICAL ELEMENTS AND METHOD" filed 8 Mar. 2010, which is incorporated herein by reference), an equivalent inductance (that includes a fixed inductance component 312 and a variable inductance component 302 that can be tuned as described in U.S. patent application Ser. No. 12/719,841), and an equivalent resistance (that includes a fixed resistance component 313 and a variable resistance component 303 that can be tuned as described in U.S. patent application Ser. No. 12/719,841).

In some embodiments, the characteristic impedance $Z_1$ of low-power RF driver 345 and its equivalent capacitance 321, equivalent inductance 322, and equivalent resistance 323 matches the characteristic impedance $Z_1$ of cable 330 and the characteristic impedance $Z_1$ of the input port of remote power amplifier 108. Also, in some embodiments, the characteristic impedance $Z_0$ of the output port of remote power amplifier 108 matches the characteristic impedance $Z_0$ of the antenna element 310 in the presence of variable disturbance 66. Note that in some embodiments, $Z_1$ is designed to be equal to $Z_0$ for convenience, while in other embodiments, $Z_1$ is set to a first value that is easiest to meet for a given RF driver 345, cable 330 and the input impedance of power amplifier 108, while $Z_0$ is set to a value that is more convenient for meeting given the input impedance of power amplifier 108, and the characteristic impedance of the output resonant-filter frequency and antenna array elements 304.

In some embodiments, detector-controller 203 is physically located in the distal control room 320, and measures and controls the $Z_0$ from this distal location, as shown in FIG. 3A. When in the distal location, detector-controller 203 need not be high-field compatible. In other embodiments, detector-controller 203 is physically located in the remote environment 310, and measures and controls the $Z_0$ from this location in remote environment 310. When in the remote environment 310, detector-controller 203 should be high-field compatible (e.g., made completely of non-ferrous materials). In some embodiments, having the distributed power amplifier 108 as well as the variable components 301, 302, and 302 all located in the remote environment 310 may make it most convenient to also locate the detector-controller 203 in the remote environment 310 adjacent the parts it is measuring and controlling rather than in the distal control room 320.

In some embodiments, at least one variable antenna element 304 is included (e.g., in some embodiments, coupled to the upper nodes of variable capacitor 301, variable inductor 302, and variable resistor 302, wherein the physical length, position and shape of one or more antenna elements are varied (such as described in U.S. patent application Ser. No. 12/719,841 titled "REMOTELY ADJUSTABLE REACTIVE AND RESISTIVE ELECTRICAL ELEMENTS AND METHOD" filed 8 Mar. 2010, which is incorporated herein by reference) under the control of detector-controller 203 shown in FIG. 2). In some embodiments, when in the presence of a variable disturbance 66 having a first characteristic (such as a piece of material, a person, or a weather situation), the capacitance, inductance and/or resistance of tuned circuit 310 are adjusted by varying the variable aspects of variable capacitance component 301, variable inductance component 302 and variable resistance component 303 using one or more sensing units (such as detectors 641, 642 and 643 of FIG. 6) and one or more motor controllers 145 and motors 140. In some embodiments, a detector-controller 601 (which may include circuit and/or microprocessor components, such as described above for FIG. 6) is coupled (e.g., in some embodiments, connected to transmission line 119) to measure electrical parameters of the signals (e.g., at the left end of transmission line 119), and based on the measurement(s), to control the variable parameters (e.g., resistance, inductance, capacitance, antenna length, resonant frequency, impedance at a given frequency, field shape, field direction, field spatial shape, field intensity, and like characteristics) in the remote tuned circuit 310.

FIG. 3B is a block diagram of impedance-matched high-frequency circuit 300, and having a different external impedance disturbance 66' having a second effect on circuit 300 (i.e., an external impedance disturbance that is different than external impedance disturbance 66 of FIG. 3A; e.g., adding some impedance offset $\Delta Z$ such that the impedance of circuit 310 without compensation would be $Z_0 + \Delta Z$). In some embodiments, the present invention is used to adjust the RLC parameters of variable components 303, 302 and 301 and optionally the length of antenna 304 in order to subtract a compensating impedance $(-\Delta Z)$ rebalance the circuit 310' to again have the characteristic impedance $Z_0$ $(=Z_0 - \Delta Z - \Delta Z)$ that matches the output impedance of the remote power amplifier 108 (in terms of characteristic impedance, frequency, Q, and/or other factor) in the presence of the changed external impedance disturbance 66'. In some embodiments, the present invention provides the capability to automatically adjust such parameters in the adjusted tuned circuit 310' "in real time" (i.e., quickly as the external impedance disturbance 66' changes over time).

Figure 4A:
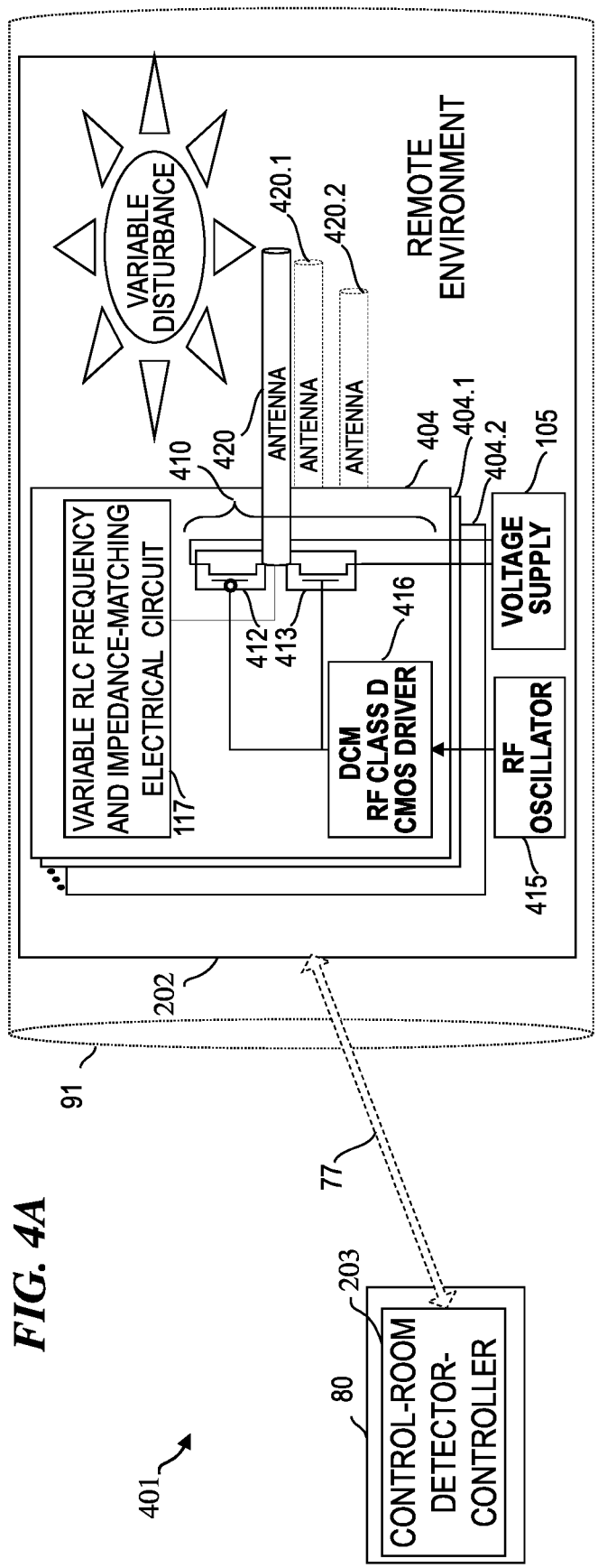
FIG. 4A is a block diagram of a variable antenna subsystem 401 driven by a pair of field-effect transistors (FETs) having complementary polarities (i.e., P-type and N-type) according to one embodiment of the present invention, wherein one variable antenna 420 is set to a first length, and a plurality of antenna elements (e.g., 420 through 420.2) are provided.

FIG. 4A is a block diagram of a variable antenna subsystem 401, wherein each antenna element 420, and optionally 420.1 through 420.2, is driven by its own pair of FETs having the complementary polarities (i.e., P-type and N-type) according to one embodiment of the present invention, wherein variable antenna element 420 is set to a first length, and CMOS FETS 412 and 413 are mounted on antenna element 420 for better impedance matching and heat-control. As discussed above, some embodiments include the detector-controller 203 in the control room 80 (a local environment that is distal from the remote distributed power amplifier 410). In some embodiments, the distributed power amplifier 410 includes a Class D RF driver 416 for CMOS output transistors (P-type FET 412 and N-type FET 413), and provides a duty-cycle-modulated (DCM) signal (e.g., in some embodiments, a PWM signal) that when filtered by the antenna and its variable RLC circuit 117, produces the desired RF pulse (which includes a plurality of cycles of RF radio waves (e.g., radio waves tuned to a Larmor frequency) used to excite the nuclear-magnetic-resonance (NMR) response in the tissues of the patient). In some embodiments, the variable RLC circuit 117 and antenna 420's length are controlled by detector-controller 203 in the control room 80, while in other embodiments, variable RLC circuit 117 and antenna 420's length are controlled by frequency-impedance matching (FIM) circuitry (equivalent to detector controller 203) that is within the MR magnet bore 91. In some embodiments, each of a plurality of antenna elements 420 has its own power amplifier and impedance-matching circuitry 404, and in some embodiments, they share a common RF oscillator 415 (or PWM-signal source) and a common power supply 105 (which may include a voltage or current source). In some embodiments, the control signal 77 includes a wireless link, while in other embodiments, a wired (e.g., coax or 10 gigabit category 6A cable or the like). Because the power amplification is done in the remote environment 202, the need for very-high-power coax (conventional systems may need coax capable of carrying 30 kW or more) is reduced or eliminated, and wireless communication of the low-power RF signal or even just generation of a local RF signal in the remote environment 202 can be done wirelessly.

Figure 4B:
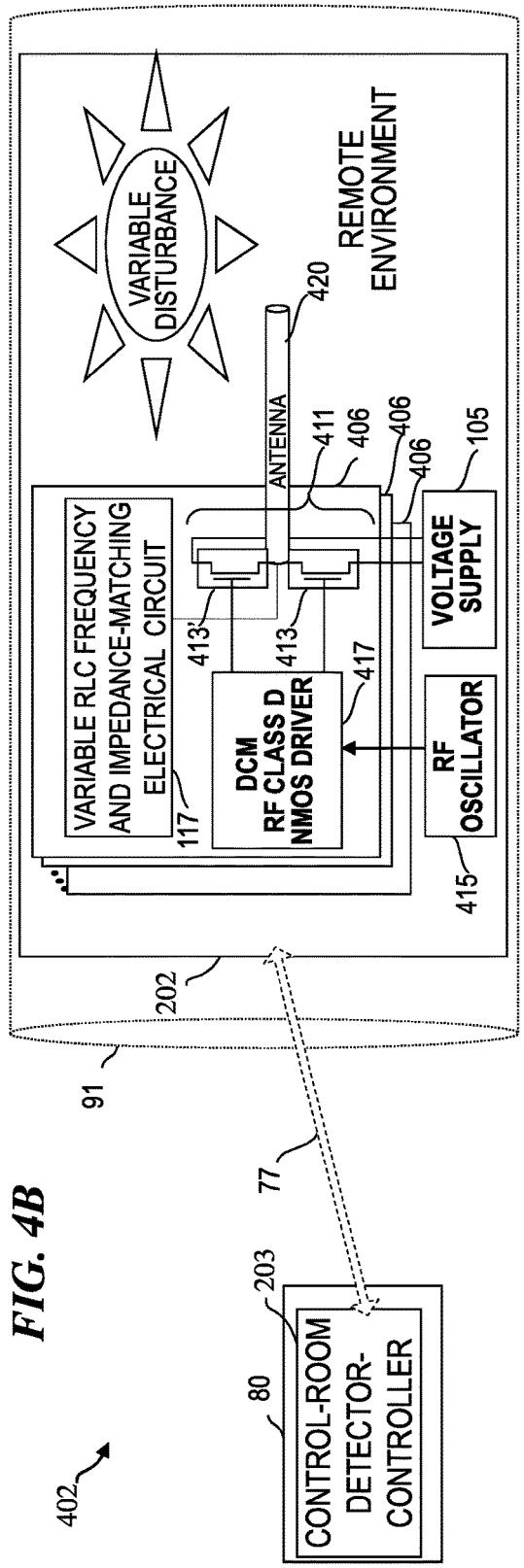
FIG. 4B is a block diagram of variable antenna subsystem 403 driven by a pair of FETs having the same polarity (e.g., both N-type in some embodiments) according to one embodiment of the present invention, wherein the one variable antenna 420 shown is set to a first length.

FIG. 4B is a block diagram of variable antenna subsystem 402, wherein variable antenna 420 is set to a first length. This subsystem 402 is substantially similar to subsystem 401 of FIG. 4A, except that the CMOS pair of transistors 412 and 413 is replaced by a pair of NMOS transistors 413 and 413' (both the same polarity—NMOS here, but in other embodiments, both are PMOS transistors), and the Class D RF driver 416 for CMOS output transistors has been replaced by a Class D RF driver 417 for NMOS output transistors (N-type FET 413' and N-type FET 413), and provides a bias-adjusted (biased to provide the proper voltages for turning one transistor completely off when the other transistor is completely on) DCM signal (e.g., in some embodiments, a PWM signal) that when filtered by the antenna and its variable RLC circuit 117, produces the desired RF pulse (a plurality of cycles of RF radio waves used to excite the nuclear-magnetic-resonance (NMR) response in the tissues of the patient), and provides a duty-cycle-modulated (DCM) signal (e.g., in some embodiments, a PWM signal) that when filtered by the antenna and its variable RLC circuit 117, produces the desired RF pulse (a plurality of cycles of RF radio waves used to excite the nuclear-magnetic-resonance (NMR) response in the tissues of the patient). In the embodiment shown, the length of antenna element 420 is shown as adjusted to a first length.

Figure 4C:
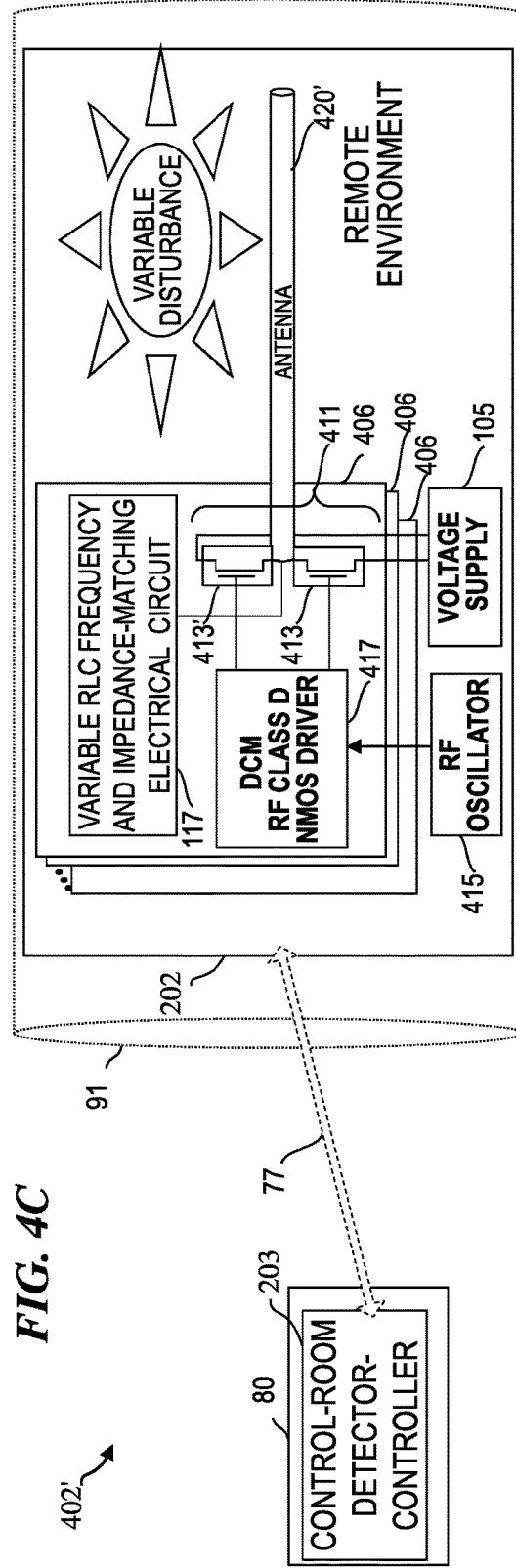
FIG. 4C is a block diagram of variable antenna subsystem 403 driven by a pair of FETs having the same polarity (e.g., both N-type in some embodiments) according to one embodiment of the present invention, wherein the one variable antenna 420' (the same element as antenna 420 of FIG. 4B, but in a different configuration) is set to a second length.

FIG. 4C is a block diagram of variable antenna subsystem 402' (otherwise identical to subsystem 402 of FIG. 4B) but wherein variable antenna 420' is set to a second length as a result of frequency and/or impedance matching.

Figure 4D:
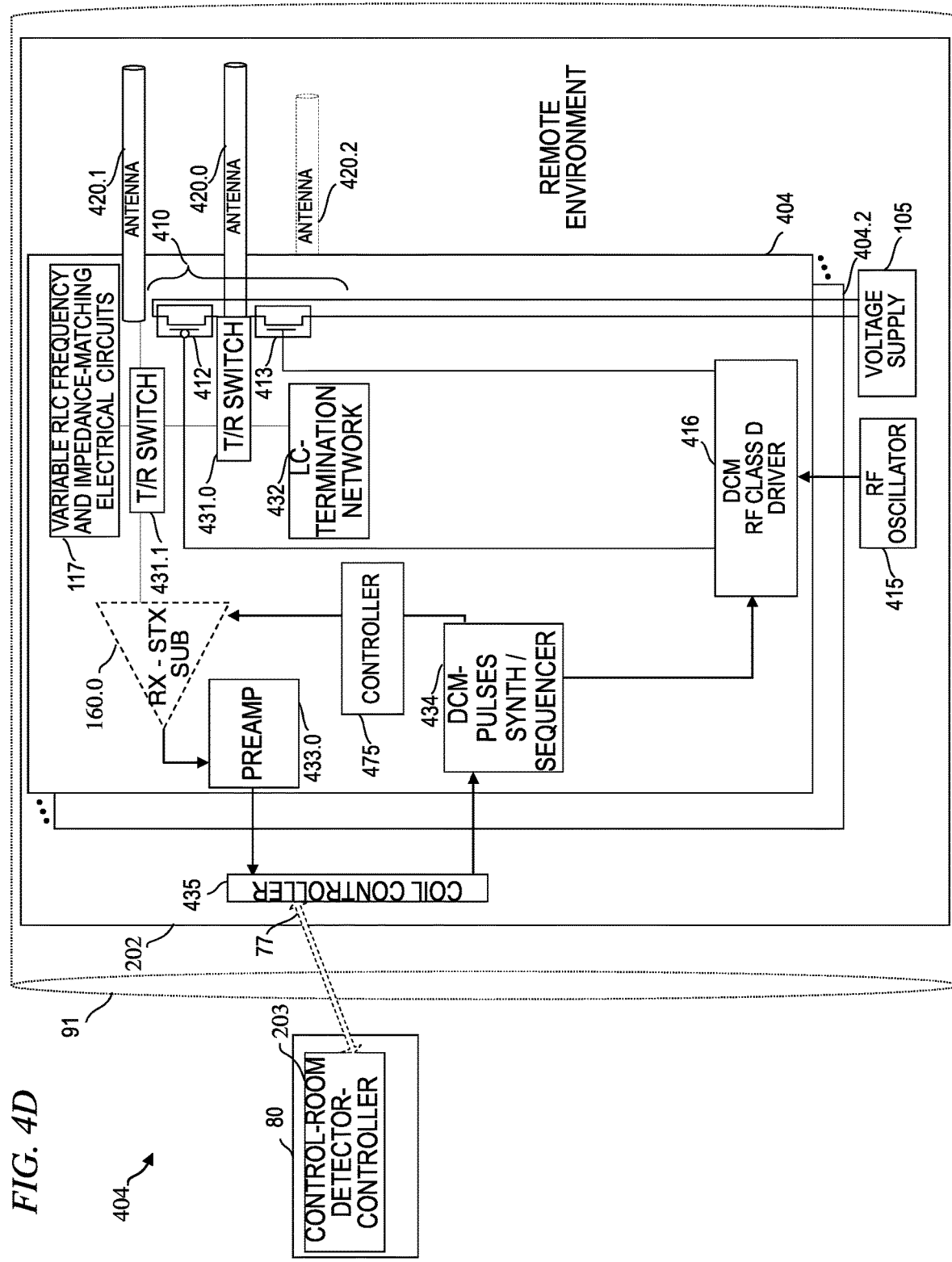
FIG. 4D is a block diagram of variable antenna subsystem 404, wherein each one of a plurality of antennae is driven by a different transmit-amplifier and receiver-pre-amplifier unit 404.

FIG. 4D is a block diagram of variable antenna subsystem 404, wherein each one of a plurality of antennae is driven by a different transmit-amplifier and receiver-pre-amplifier unit 404 (the other one or more units numbered through 404.2). In some embodiments, each unit 404.0-404.2 includes a power amplifier (e.g., driver 416 and one or more transistor(s) 412-413), a receive pre-amplifier 433, and a transmit/receive (T/R) switch 431 used to change from transmit mode to receive mode, according to one embodiment of the present invention. In order to provide simultaneous transmit-receive operations, each T/R switch 431 operates such that when the corresponding antenna element 420 is being used in transmit mode (e.g., in FIG. 4D, T/R switch 431.0 is in transmit mode and a version of the transmit signal (e.g., a version that is phase and/or amplitude adjusted relative to other versions being transmitted at the same time) is connected to antenna element 420.0, and simultaneously, T/R switch 431.1 is in receive mode and the receive signal from antenna element 420.1 is connected through its T/R switch 431.1 to its unit 160 (e.g., in some embodiments, one of a plurality of such units 160) that removes the transmit artifacts (e.g., in some embodiments, filters the frequency components of the transmit signal to remove undesired frequencies). In some embodiments, the heat-generating elements (e.g., the power FETS 412-412) are mounted on and/or thermally connected to respective ones of antenna elements 420 through 420.2 for better impedance matching and heat-control. As discussed above, some embodiments include the detector-controller 203 in the distal control room 80 (distal from the distributed power amplifier and receiver preamp unit 430). In some embodiments, the distributed power amplifier 430 includes a Class D RF driver 416 for CMOS output P-type FET 412 and N-type FET 413, such as shown in FIG. 4A and described above. In other embodiments, rather than using a Class D power amplifier as shown here, other types of RF power amplifiers are used, including Class A, Class AB, or other suitable types. Although shown here as including a p-FET 412 and n-FET 413, the output stage in other embodiments include any other suitable electronic or opto-electronic amplifier devices. In some embodiments, the variable characteristics of RLC circuit 117 and antenna 420's variable length are controlled by detector-controller 203 in the control room 80, while in other embodiments, variable RLC circuit 117 and antenna 420's length are controlled by frequency-impedance matching (FIM) circuitry in coil 77 controller 432 (in some embodiments, equivalent to that which is otherwise included in detector controller 203) that is within the MR magnet bore 91. In some embodiments, each of a plurality of antenna elements 420 has its own power amplifier and impedance-matching circuitry 404, and in some embodiments, they share a common RF oscillator 415 (or PWM-signal source) and a common power supply 105 (which may include a voltage or current source). In some embodiments, the control signal 77 includes a wireless link, while in other embodiments, a wired (e.g., coax, 10 gigabit category 6A cable or the like) or optical fiber is used for carrying the control and/or RF signals. Because the power amplification is done in the remote environment 202, the need for very-high-power coax (conventional systems may need coax capable of carrying 30 kW or more) is reduced or eliminated, and wireless communication of the low-power RF signal or even just generation of a local RF signal in the remote environment 202 can be performed and controlled wirelessly. In some embodiments, the low-power DCM signal pulses (which can be up to 4.5 GHz or higher) are generated in circuit 434 in the remote environment 202. In other embodiments, these DCM pulse streams are generated in the control room 80 (or elsewhere away from the magnet bore) as low-power electrical signals, and are carried to subsystem 403 via low-power coax or high-speed Ethernet cabling (wherein such electrical cabling is made of polymers, copper or other high-field MR-compatible materials). In some embodiments, the controller 475 provides signal-processing control to unit 434 such that the transmitted signal is pre-processed to remove certain frequencies and to leave other frequency components or other features (e.g., in some embodiments, a Larmor carrier frequency is among the frequencies left in order to more efficiently excite the atoms or molecules of interest), i.e., frequencies that are later removable from the simultaneously received signal, and to unit 160, such that the transmitted signal components are removed from the received signal from T/R switch 431 to protect pre-amp 433 from high-power transmit signals picked up by the receive antenna elements 420.

In still other embodiments, these DCM pulse streams are generated in the control room 80 (or elsewhere away from the magnet bore) as optical signals, and are carried to subsystem 403 via optical fiber. In some such embodiments, DCM RF driver 416 converts the optical signals to electrical pulses that drive the output FET(s) 412-413. Note that in embodiments using Class AB or other types of output stages, the optical signal may represent the actual RF cycles of the desired Larmor-frequency excitation pulse. In some embodiments, the optical signal (or other low-power signal) is pre-distorted in order to compensate for characteristics of the power-amplifier circuitry in portion 404, in order to obtain the desired high-power RF output signal.

In some embodiments, each set of output transistor(s) 412-412 are directly connected to their respective antenna element 420 using very short leads, to reduce mismatched impedances. In other embodiments, T/R switch 431 includes a multiple-pole electronic switch or RF relay (e.g., in some embodiments, including PIN diodes or other suitable switching diodes such as described in U.S. Pat. No. 4,763,076 to Arakawa et al. (incorporated herein by reference)) that switches from a transmit state or mode to a receive state or mode. In transmit mode, the output of the power amplifier (having an output impedance that matches the impedance of antenna 420) is coupled to antenna 420 to transmit its output signal, and simultaneously the input to the preamp 433 is disconnected from the antenna and instead is coupled to a matched terminating impedance (a terminating impedance that matches the input impedance of the preamp 433) such that substantially no signal gets coupled to the input of preamp 433. In receive mode, the input to the preamp 433 is coupled to antenna 420 to receive its input (received) signal, and simultaneously the output of the power amplifier is disconnected from the antenna and instead is coupled to a matched terminating impedance (a terminating impedance that matches the output impedance of the power amplifier 410) such that substantially no signal from the power amplifier gets inadvertently coupled to the input of preamp 433 (and in some embodiments, both FETs 412 and 413 are turned off (to a high impedance state)). When in receive mode, the circuit disconnects or disables the RF source signal from the input of the driver circuit 416. In some embodiments, a T/R switch 436 similar to T/R switch 431 described above is used, when in the receive state, to disconnect signals from the input of driver 416 and to instead connect a matched termination impedance 437 to the input of driver 416, but when in the transmit state, connect signals from circuit 434 to the input of driver 416 and the impedances of these are matched to one another. In other embodiments, T/R switch 436 is omitted. In some embodiments, controller 435 supplies control signals to control the switching of T/R switch 431 and/or T/R switch 436 and/or driver 416 (in order to turn off both FETs 412 and 413 when in receive mode).

In some embodiments, controller 435 supplies control signals to frequency-and-impedance-matching (FIM) circuit 117 (in order to adjust impedances of the various transmission-line elements that carry signals from one output to another input to match one another, and to match the resonance frequencies of various elements to the desired transmit or receive frequencies) and receives and measures appropriate sense signals (e.g., to measure voltage-standing-wave ratios (VSWRs) or other suitable parameters, in order to control the FIM operations).

FIG. 5A shows the waveforms of a control pulse 500 used in some embodiments to obtain a PWM seed signal. In some embodiments, control pulse 500 determines the start time and duration of the output RF pulse 505 (see FIG. 5E).

FIG. 5B shows the waveforms of an RF sine-wave seed signal and a gated higher-frequency triangle or saw-tooth wave use in some embodiments to obtain a PWM seed signal. In some embodiments, these two signals are compared such that for each time period when the triangle wave is greater than the sine wave, a pulse is generated. The resulting PWM pulse stream 503 is shown in FIG. 5C.

FIG. 5C shows the waveform of a PWM seed signal. In some embodiments, this signal is generated as described in FIG. 5B. In other embodiments, other ways of generating a comparable waveform are used (e.g., cyclic digital oscillators, table lookup from a high-speed memory or the like).

FIG. 5D shows the waveform of an amplified PWM signal. Because of the rise and fall times of this signal being much faster than the dv/dt (change in voltage over time) of the RF sine wave, the efficiency of a Class D power amplifier is greater than alternatives such as a Class AB power amplifier. This PWM signal is then fed to a high-Q resonator that includes the antenna element (e.g., circuit 117 and antenna 420 of FIG. 4A or 4B), which performs a narrow-bandwidth bandpass filter function and outputs the signal shown in FIG. 5E.

FIG. 5E shows the waveform of a filtered amplified RF sine-wave signal resulting from the process described for FIGS. 5A-5D above.

FIG. 6 is a flowchart of a method 600 according to some embodiments of the invention. In some embodiments, method 600 starts by selecting 610 one or more (e.g., in some embodiments, a plurality of) criteria (in some embodiments, parameters such as impedance and frequency, in other embodiments, any other desired condition) to optimize. Next, a circuit (e.g., under control of non-magnetic mechanical movement devices) performs configuring 611 for excitation (e.g., transmitting to or receiving from) the remote circuit elements. In some embodiments, the RF excitation signal is power amplified 620 by a power amplifier located on or next to the antenna element, and optionally filtered 621 at and/or before it is coupled to the high-Q antenna. In some embodiments, the RF signal to be transmitted is filtered 621 to remove certain frequency components having frequencies that are expected to be in the resulting received from the object or patient being examined, in order that an equivalent or corresponding filtering operation can be performed on the received signal to remove those excitation frequency components that were left in the transmit signal. In some embodiments, at least a portion of the filtering 621 is performed before the power amplification of process 620. In some embodiments, at least a portion of the filtering 621 is performed by the transmit antenna elements themselves. The next block includes delivering 612 the excitation (radiating the RF radio waves in the MR magnet bore from the transmit elements of the transmit coil). The next block includes detecting 614 a received signal from the remote elements. The next block includes checking 615 for satisfactory parameters (e.g., the impedance and frequency of the signal) of the received signal from the remote elements. If the result is unsatisfactory, the method then includes adjusting 617 one or more of the variable reactance elements using the non-magnetic mechanical movement device(s) and going to block 611 to iteratively repeat the process 611 through 615. If the result of checking 615 is satisfactory, the method goes to performing 616 the operation for which the components were adjusted (e.g., obtaining a magnetic resonance result (such as an image). In some embodiments, blocks 615 and 617 are omitted (such that no feedback control is exercised) and the system operates on predetermined parameters that are not adjusted during operation.

FIG. 7 is a flowchart of a method 700 according to some embodiments of the invention. In some embodiments, method 700 starts by pre-measuring 710 one or more (e.g., in some embodiments, a plurality of) criteria (in some embodiments, patient parameters such as those affecting impedance and frequency, or the frequency and impedance parameters that are affected by the patient; in other embodiments, any other desired condition) to optimize. Next, a circuit (e.g., under control of non-magnetic mechanical movement devices) performs configuring 711 for excitation (e.g., transmitting to and/or receiving from) the remote circuit elements (e.g., remote antenna elements or MRI coil elements). In some embodiments, the RF excitation TX signal is filtered and power amplified by a power amplifier located on or next to the antenna element, and radiated from the high-Q antenna to deliver 712 the TX excitation signal to the object or patient. The delivering 712 the excitation (radiating the RF radio waves in the MR magnet bore) excited the atoms or molecules of interest. The next block includes receiving 713 a received signal from the remote elements. The next block includes removing 714 transmit RF components from the received signal from the remote elements to generate a net received (NRX) signal. If the NRX-signal result is unsatisfactory, the method then includes adjusting 717 one or more of the variable reactance elements using the non-magnetic mechanical movement device(s) and/or adjusting filtering parameters for the transmit and/or receive channels of the system and going to block 711 to iteratively repeat the process 711 through 715. If the result of checking 715 is satisfactory, the method goes to performing 716 the operation on the NRX signals for which the components were adjusted (e.g., obtaining a magnetic resonance result (such as an image). In some embodiments, blocks 715 and 717 are omitted (such that no feedback control is exercised) and the system operates on predetermined parameters that are not adjusted during operation.

Figure 8:
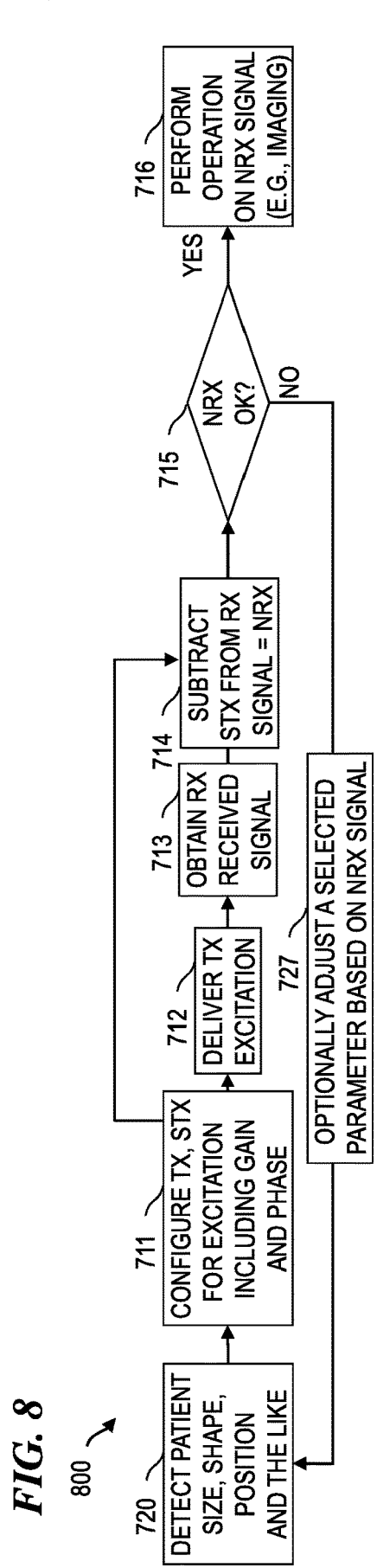
FIG. 8 is a flowchart of a method 800 according to some embodiments of the invention.

FIG. 8 is a flowchart of a method 800 according to some embodiments of the invention. In some embodiments, method 800 starts by measuring 720 one or more (e.g., in some embodiments, a plurality of) criteria on the patient while the patient is in the MRI bore (in some embodiments, patient parameters such as those affecting impedance and frequency, or the frequency and impedance parameters that are affected by the patient; in other embodiments, any other desired condition to optimize). The next few aspects 712-715 are as described above for FIG. 7. Block 715 checks the resulting NRX signal to determine whether it is satisfactory, and if not to determine how to adjust parameters to better match frequency and impedance and better remove the transmitted signal components from the RX signal. If the NRX-signal result is unsatisfactory, the method then includes adjusting 727 one or more of the variable reactance elements using the non-magnetic mechanical movement device(s) and/or adjusting filtering parameters for the transmit and/or receive channels of the system and going to block 720 to iteratively repeat the process 720 through 715. If the result of checking 715 is satisfactory, the method goes to performing 716 the operation on the NRX signals for which the components were adjusted (e.g., obtaining a magnetic resonance result (such as an image). In some embodiments, blocks 715 and 727 are omitted (such that no feedback control is exercised) and the system operates on predetermined parameters that are not adjusted during operation.

Figure 9A:
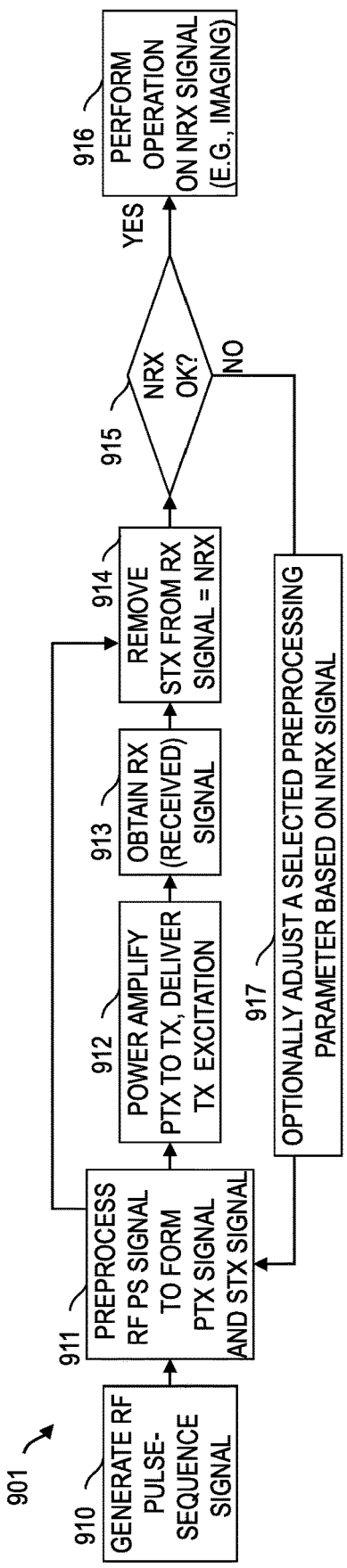
FIG. 9A is a flowchart of a method 901 according to some embodiments of the invention.

FIG. 9A is a flowchart of a method 901 according to some embodiments of the invention. In some embodiments, method 900 starts by generating 910 an RF pulse-sequence (PS) signal, then preprocessing 911 the RF PS signal to form a pre-processed transmit (PTX) signal that is to be amplified and transmitted and a subtractive-control-transmit (STX) signal that is used to control post processing of the received signal to remove transmit artifacts from the received signal at block 914. The next block includes power amplifying 912 the PTX signal to obtain a power-amplified TX signal and delivering the TX signal to the object or patient being examined. The next block includes obtaining, simultaneously with the delivering the TX signal to the object or patient, a received RX signal (which will include undesired components of the TX signal). The next block includes post-processing and removing 914 those undesired components of the TX signal from the RX signal to obtain a net received (NRX) signal. In some embodiments, block 914 receives input parameters or signals from the pre-processing 911 operation. The next block includes checking 915 to determine whether the NRX signal is satisfactory, and if not then adjusting 917 one or more selected pre-processing parameters based on an analysis of the NRX signal (and/or based on a further analysis of the RX signal) and going to block 911 to iterate again through blocks 911-915. In some embodiments, blocks 915 and 917 are omitted (such that no feedback control is exercised) and the system operates on predetermined parameters that are not adjusted during operation.

Figure 9B:
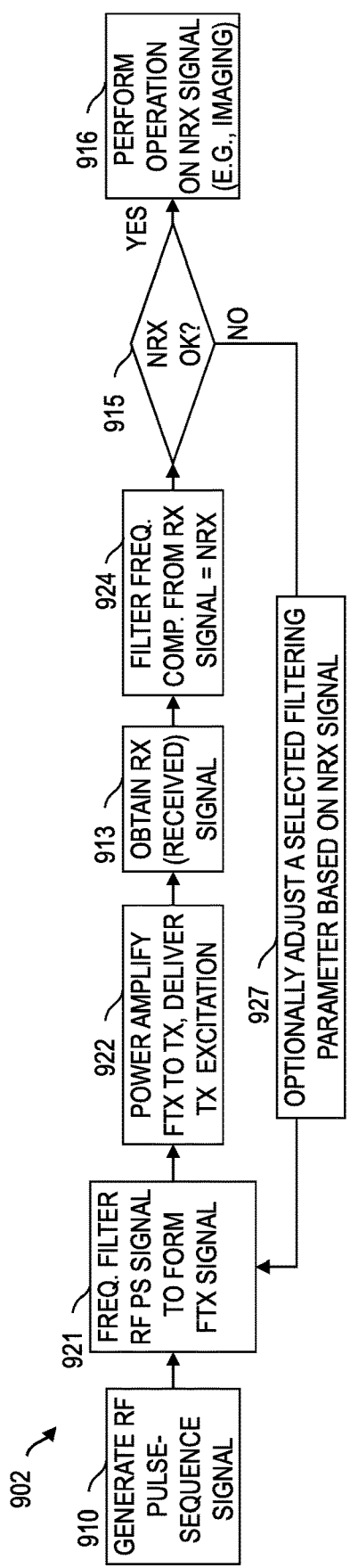
FIG. 9B is a flowchart of a method 902 according to some embodiments of the invention.

FIG. 9B is a flowchart of a method 902 according to some embodiments of the invention. Method 902 is a special subset of method 901 of FIG. 9A, wherein block 911 of FIG. 9A is instead replaced by frequency filtering 921 the RF PS signal for form a filtered transmit (FTX) signal, block 912 of FIG. 9A is replaced by power amplifying 922 the FTX signal to form the TX signal that is coupled to the transmit-coil elements, block 914 of FIG. 9A is replaced by filtering 924 to remove undesired frequency components of the TX signal, and block 917 of FIG. 9A is replaced by adjusting 927 one or more selected filtering parameters based on an analysis of the NRX signal (and/or based on a further analysis of the RX signal) and going to block 921 to iterate again through blocks 921-915. In some embodiments, blocks 915 and 927 are omitted (such that no feedback control is exercised) and the system operates on predetermined parameters that are not adjusted during operation.

In some embodiments, the filtering of the transmit signal leaves one set of sideband frequencies (e.g., in some embodiments, the TX signal is filtered to leave just those sideband frequencies higher than the carrier frequency; in other embodiments, the TX signal is filtered to leave just those sideband frequencies lower than the carrier frequency) in the signal that is power amplified and then transmitted. In some such embodiments, the carrier frequency is also substantially reduced or eliminated from the transmit signal. In other such embodiments, the carrier frequency is left as a substantial portion of the transmit signal.

In some embodiments, the filtering of the receive signal leaves one set of sideband frequencies (e.g., in some embodiments, the RX signal is filtered to leave just those sideband frequencies lower than the carrier frequency if the transmit signal included just the sideband frequencies higher than the carrier frequency; in other embodiments, the RX signal is filtered to leave just those sideband frequencies higher than the carrier frequency if the transmit signal included just the sideband frequencies lower than the carrier frequency) in the signal that is received, filtered, and then pre-amplified and then coupled to the processing circuitry for the received signal. In some such embodiments, the carrier frequency is also substantially reduced or eliminated from the receive signal, and then later re-introduced to reconstruct the opposite sideband from the sideband left in the received signal. In other such embodiments, the carrier frequency is left as a substantial portion of the receive signal, in order to use it to reconstruct the opposite sideband from the sideband left in the received signal.

In some embodiments, a combination of sideband filtering AND subtracting of a version of the transmit signal from the received signal is used. For example, in some embodiments, the TX signal is filtered to leave just a first single sideband (i.e., only frequencies higher or lower than the carrier) or a carrier frequency and the first single sideband, and a version of this filtered transmit signal is subtracted from the received signal, either before or after the received signal is sideband filtered to leave only the second sideband (i.e., only frequencies lower or higher than the carrier respectively) in the net received signal.

In some embodiments, the present invention includes a combination of features that are individually described in the various figures and descriptions.

In some embodiments, the present invention uses distributed power amplifiers along with electronically controlled frequency-impedance-matching circuits (e.g., PIN diode-controlled capacitances and/or inductances and/or antenna lengths) and/or variable resistors, inductors and/or capacitors that have their electrical-circuit values controlled by one or more electrically controlled mechanical positioners. In some embodiments, the distributed power amplifiers and electronically controlled FIM circuits include metals that have only substantially non-magnetic components such that the resistors, inductors and/or capacitors and the mechanical positioner(s) that adjust their variable values can be placed and operated within and/or near an extremely high electric field of many thousands of volts (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

Some embodiments of the invention include an apparatus that includes a non-magnetic positioner, and an electrical component connected to the motor and configured to have at least one of its parameters varied by the positioner. In some embodiments of the apparatus, the positioner comprises a piezo-electric motor. In some embodiments of the apparatus, the electrical component includes an inductor, and wherein the at least one of its parameters includes an inductance. In some embodiments of the apparatus, the electrical component includes a capacitor, and wherein the at least one of its parameters includes a capacitance. In some embodiments of the apparatus, the electrical component includes a resistor, and wherein the at least one of its parameters includes a resistance. Some embodiments further include a programmable information-processing device operatively coupled to control the positioner in order to vary an electrical parameter of the electrical component. Some embodiments further include a feedback circuit operatively coupled to the programmable information-processing device to provide feedback control of the positioner in order to maintain the electrical parameter of the electrical component.

Some embodiments of the invention include an apparatus that includes an electrical component, and means, as described and shown herein and equivalents thereof, for automatically adjusting its impedance.

In some embodiments, the method of the present invention is executed on a computer at a location remote from a user, and controlled by the user across the internet. In some embodiments, the method is executed on a computer at a location remote from the variable electrical components. In some such embodiments, the method is controlled by the computer across a network.

In some embodiments, the present invention includes one or more of any one or more of the devices in any of the figures herein in a combined circuit that connects the described variable components and distributed power amplifiers, optionally including other conventional components. In some embodiments, the present invention provides an RF coil for MRI or EPR (electron paramagnetic resonance) spectroscopy or imaging, or any other antenna, wherein a combination of coil and amplifier-places the RF power amplifier for the system out of external box (the circuitry in the distal control room) and instead distributes the power amplification over the body of the coil (e.g., placing a power amplifier at or on each of a plurality of antenna elements).

In contrast, in some embodiments, the present invention provides power FETs, one or more per each of a plurality of coil elements, and thus the present invention can omit the combiners typically needed to combine signals from multiple transmit amplifiers, and instead mount one or more FET amplifier per coil element. In some embodiments, the present invention uses the coil elements for the heat sink of the power amplifiers, and distributes the heat over the coil, which in various embodiments, includes any multiple-element transmit coil. In some embodiments, the coil includes a body, head, or surface coil for an MRI machine. In some embodiments, the RF and/or control signals are sent wirelessly or over small cables or over optical fibers. The present invention provides, for the first time, a capability to wirelessly send or control the RF to the transmit coils. In some embodiments, dedicated transmit amplifiers are provided for dedicated antenna elements. The present invention facilitates manipulation of the field to use for $B_1$ shimming or transmit-sense functionality. The present invention provides better imaging since it easily switches from different subsets of the multiple individually controlled elements to change the transmitted signal's phase, magnitude, spatial profile (field shape in space), temporal profile (pulse shape in time), and frequency (all controllable as independent variables), in order to optimize the signal to particular position of interest (the volume element or VOXEL), to maximize signal-to-noise (S/N) and/or contrast and/or spectral and/or spatial resolution, as well as minimizing specific absorption rate (SAR) and heating of the patient and components in the magnet bore. The present invention provides better performance through parallel imaging (this saves time especially), especially when using parallel transmit signals (e.g., in some embodiments, using a plurality of parallel optical fibers to carry the transmit signals (e.g., either the DCM pulses to drive a Class D output that then filters to obtain the RF transmit pulse, or the RF pulse itself for a Class AB output, and optionally pre-compensates or distorts the signal on the optical fiber), or RF parallel transmit-receive. In some embodiments, the present invention provides transmit sense capability (which transmits different pulse widths over different antenna elements). In some embodiments, this provides RF-field focussing and optimization.

In some embodiments, the present invention obtains receive signals from multiple antenna elements in parallel, generates and carries these as electrical or optical signals to the distal control room, then combines these signals (externally to the magnet room) with each other and with the subtractable version of the transmit signal. In some embodiments, the apparatus transmits signals from many of elements simultaneously, which saves time on spatial encoding. In some embodiments, speed-up or acceleration factors of five to six times or more are obtained for given image or given quality from this parallel imaging. The present invention provides faster MRIs, provides better control over RF to direct the transmitted signal only to the region of interest, uses higher frequencies for better S/N, and controls shim fields better. In some embodiments, the present invention provides a better coil that includes both parallel transmit or parallel transmit-receive in the RF coil itself.

In some embodiments, the present invention provides one or more of the following features and/or advantages:
  distributed receive amplifiers at T/R switches in coil;
  power amplifier distributed over coil, with one or more FETS on or near coil element;
  support for various coil element types: stripline, loop, dipole antenna, monopole antennas; and/or
  connection methods between power amplifier and antenna elements that include wirebond, solder directly to it, mount FET chip directly to coil element, or screw stud of FET into end or side of antenna element.

In some embodiments, a wireless transmit coil that has wireless receiver on the element in magnet to obtain better S/N, which still needs a DC power cable that is relatively small out-of way wires rather than huge RF power coax cables. In some embodiments, it may have other control lines to FET like T/R switch control. In some embodiments, 16 or 32 parallel antenna rods in a cylindrical coil unit are used—the antenna elements can include cylindrical or coaxial-adjustment antenna elements. The entire coil can be a volume coil (cylindrical or ellipsoidal or other odd shapes)

or just surround volume as a surface (flat plane or curved surfaces) coil. In some embodiments, the power amplifier mounts on an end of the antenna elements (in some embodiments, this provides a voltage source for half-wave capacitively shortened resonator or stripline or microstrip or coaxial line antenna elements) or at the center of the antenna elements (in some embodiments, this provides current source for dipole antenna.) In some embodiments, the elements can be arranged as any other array form, with antenna elements displaced in XY or XYZ directions. In some embodiments, the present invention provides a pair of arrays that are end-to-end to one another. The present invention facilitates more geometries because there is more real estate (volume room). In some embodiments, other units that are dedicated on, at, or near the antenna element include:

- power amplifier (power FET);
- preamp GAAS FET;
- pin diode switch;
- T/R switch (PIN);
- wireless receiver—RF input to transmitter);
- wireless transmitter-get signal from preamp and send to external;
- wireless controls-control PIN switch to tell when to switch;
- to turn power amp on-off, pr receiver on-off (or "blank" one or both);
- hardwire or program on-board memory to drive long pulse sequences at chip; and/or
- active tuning-smart VSWR tuning or go back to through wireless or wired control to console computer (automatic frequency tuning and/or impedance matching).

In the past, the only elements in the MR magnet bore were preamps, and PIN-diode switching elements (diodes having positive-intrinsic-negative (PIN) regions) to control alternating transmit-receive operations or detuning circuitry activated for the receive elements during transmit so the receive elements do not receive what is being transmitting while it is being transmitted.

In some embodiments, the RF coil unit size is made to fit the diameter of the MRI bore (standard bore inside magnet inside Faraday cage industry body coil 65-70 cm in diameter, wherein the active circuit is in range 15-18 cm long to 60 cm long. Head coils are 24-28 cm in inner diameter and circuit length (element lengths can be 15-30 cm long, but are 15-25 cm long usually). Some embodiments include 8, 16, 24, or 32 elements for head coils; body coils are generally 8 or 16 elements usually, but can have 128 elements. In some embodiments, the number of antenna elements is not a power-of-two. In some embodiments, digital control elements can adjust gain at power-of-two factors (mostly computer memory and control lines on the receive to sample directly into memory. Some embodiments include sending pulse sequences at 64 MHz (the Larmor frequency for protons at 1.5 Tesla). In some embodiments, the present invention simultaneously transmits and receives using a circulator, with the transmit port 120 degrees to the element, and 240 degrees to the receiver (typical existing circulators can be problematic since generally one cannot use ferrites in the bore of the superconductor magnet) so in some embodiments the present invention uses a ¼-wave circulator waveguide. Some embodiments further include a stripline transmission-line circulator.

In some embodiments, the present invention provides a method that includes providing a magnetic-resonance (MR) coil having a plurality of antenna elements; locating the MR coil in a bore of an MR magnet; transmitting an MR transmit signal (TX signal) using the MR coil; receiving an MR receive signal (RX signal) using the MR coil simultaneously with the transmitting of the MR transmit signal (TX signal); removing artifacts of the TX signal from the received MR receive signal (RX signal) to form a net received signal (NRX signal); and processing the net received signal (NRX signal) and generating MR output data from the processed NRX signal.

In some embodiments of the method, the removing artifacts of the transmit signal from the received MR receive signal further includes splitting an RF pulse into a first portion and a second portion, wherein the first portion is amplified and transmitted as the MR transmit signal (TX), and subtracting the second portion from the received MR receive signal (RX) to form the NRX signal.

In some embodiments of the method, the transmitting of the MR transmit signal (TX) includes transmitting a first high-power RF pulse; and coupling the first high-power RF pulse to at least the first antenna element but not to the second antenna element and coupling the second high-power RF pulse to at least the second antenna element but not to the first antenna element, wherein the power amplifying is performed in the bore of the MR magnet.

Some embodiments of the method further include coupling heat from the power amplifying the first RF pulse primarily to the first antenna element, and coupling heat from the power amplifying the second RF pulse primarily to the second antenna element.

In some embodiments of the method, the first RF pulse has a power of less than one watt and the first high-power pulse has a power of at least 100 watts.

In some embodiments of the method, the first RF pulse has a power of less than one watt and the first high-power pulse has a power of at least 1000 watts.

Some embodiments of the method further include electrically controlling an impedance of the first antenna element to match an impedance of the power amplifying.

Some embodiments of the method further include using a programmable information-processing device operatively coupled to control operation of the power amplifying in the MRI coil from a location at least one meter away from the MRI coil.

Some embodiments of the method further include using a programmable information-processing device operatively coupled to control operation of the power amplifying in the MRI coil from a location at least one meter away from the MRI coil; electrically controlling an impedance of the first antenna element to match an impedance of the power amplifying; and using a feedback signal operatively coupled to the programmable information-processing device to provide feedback control in order to control the impedance of the first antenna element.

In some embodiments of the method, the transmitting of the TX signal further includes: generating a radio-frequency (RF) pulse-sequence (PS) signal having a plurality of RF pulses each characterized by an RF carrier frequency, filtering the RF PS signal to remove a plurality of RF frequency components from the RF PS signal while substantially not removing a frequency component of the RF PS signal having a frequency equal to the RF carrier frequency, and outputting a resulting filtered pulse-sequence signal, and power amplifying the filtered pulse-sequence signal to form the TX signal; and the removing artifacts of the TX signal from the received RX signal further includes filtering the RX signal to remove at least the plurality of RF frequency components that were not removed from the RF PS signal, and outputting a resulting filtered RX signal as the NRX signal.

In some embodiments of the method, the transmitting of the TX signal further includes: generating a radio-frequency (RF) pulse-sequence (PS) signal having a plurality of RF pulses each characterized by an RF carrier frequency, comb filtering the RF PS signal to remove alternating ones of a plurality of RF frequency components from the RF PS signal while substantially not removing a frequency component of the RF PS signal having a frequency equal to the RF carrier frequency, and outputting a resulting filtered pulse-sequence signal; and power amplifying the filtered pulse-sequence signal to form the TX signal; and the removing artifacts of the TX signal from the received RX signal further includes comb filtering the RX signal to remove at least the alternating ones of the plurality of RF frequency components that were not removed from the RF PS signal, and outputting a resulting filtered RX signal as the NRX signal.

In some embodiments of the method, the transmitting of the TX signal further includes: generating a radio-frequency (RF) pulse-sequence (PS) signal having a plurality of RF pulses each characterized by an RF carrier frequency, surface-acoustic-wave (SAW) filtering the RF PS signal to remove selected ones of a plurality of RF frequency components from the RF PS signal while substantially not removing a frequency component of the RF PS signal having a frequency equal to the RF carrier frequency, and outputting a resulting filtered pulse-sequence signal, and power amplifying the filtered pulse-sequence signal to form the TX signal; and the removing artifacts of the TX signal from the received RX signal further includes SAW filtering the RX signal to remove at least the selected ones of the plurality of RF frequency components that were not removed from the RF PS signal, and outputting a resulting filtered RX signal as the NRX signal.

In some embodiments of the method, the transmitting of the TX signal further includes: generating a radio-frequency (RF) pulse-sequence (PS) signal having a plurality of RF pulses each characterized by an RF carrier frequency, preprocessing the RF PS signal to form a preprocessed transmit signal, distributively power amplifying the preprocessed transmit signal within the bore of the MR magnet to obtain a high-power RF signal, and coupling the high-power RF signal to the plurality of antenna elements in the bore of the MR magnet; the removing artifacts of the TX signal from the received RX signal to form the NRX signal further includes preamplifying to form the NRX signal after the removing of the artifacts of the TX signal. This method further includes controlling the distributively power amplifying and the preamplifying of the received RF signals by frequency-tuning and impedance-matching signals.

In some embodiments, the present invention provides a non-transient computer-readable medium having instructions stored thereon for causing a suitably programmed information processor to execute a method in a magnetic-resonance (MR) system that includes a coil having a plurality of antenna elements located a bore of an MR magnet, the method including: transmitting an MR transmit signal (TX signal) using the MR coil; receiving an MR receive signal (RX signal) using the MR coil simultaneously with the transmitting of the MR transmit signal (TX signal); removing artifacts of the TX signal from the received MR receive signal (RX signal) to form a net received signal (NRX signal); and processing the net received signal (NRX signal) and generating MR output data from the processed NRX signal.

Some embodiments of the computer-readable medium further include instructions such that the removing artifacts of the transmit signal from the received MR receive signal further includes splitting an RF pulse into a first portion and a second portion, wherein the first portion is amplified and transmitted as the MR transmit signal (TX), and subtracting the second portion from the received MR receive signal (RX) to form the NRX signal.

Some embodiments of the computer-readable medium further include instructions such that the transmitting of the MR transmit signal (TX) includes transmitting a first high-power RF pulse; and coupling the first high-power RF pulse to at least the first antenna element but not to the second antenna element and coupling the second high-power RF pulse to at least the second antenna element but not to the first antenna element, wherein the power amplifying is performed in the bore of the MR magnet.

Some embodiments of the computer-readable medium further include instructions such that the method further includes coupling heat from the power amplifying the first RF pulse primarily to the first antenna element, and coupling heat from the power amplifying the second RF pulse primarily to the second antenna element.

Some embodiments of the computer-readable medium further include instructions such that the first RF pulse has a power of less than one watt and the first high-power pulse has a power of at least 100 watts.

Some embodiments of the computer-readable medium further include instructions such that the first RF pulse has a power of less than one watt and the first high-power pulse has a power of at least 1000 watts.

Some embodiments of the computer-readable medium further include instructions such that the method further includes electrically controlling an impedance of the first antenna element to match an impedance of the power amplifying.

Some embodiments of the computer-readable medium further include instructions such that the method further includes using a programmable information-processing device operatively coupled to control operation of the power amplifying in the MRI coil from a location at least one meter away from the MRI coil.

Some embodiments of the computer-readable medium further include instructions such that the method further includes using a programmable information-processing device operatively coupled to control operation of the power amplifying in the MRI coil from a location at least one meter away from the MRI coil; electrically controlling an impedance of the first antenna element to match an impedance of the power amplifying; and using a feedback signal operatively coupled to the programmable information-processing device to provide feedback control in order to control the impedance of the first antenna element.

Some embodiments of the computer-readable medium further include instructions such that the transmitting of the TX signal further includes: generating a radio-frequency (RF) pulse-sequence (PS) signal having a plurality of RF pulses each characterized by an RF carrier frequency, filtering the RF PS signal to remove a plurality of RF frequency components from the RF PS signal while substantially not removing a frequency component of the RF PS signal having a frequency equal to the RF carrier frequency, and outputting a resulting filtered pulse-sequence signal, and power amplifying the filtered pulse-sequence signal to form the TX signal; and the removing artifacts of the TX signal from the received RX signal further includes filtering the RX signal to remove at least the plurality of RF frequency components that were not removed from the RF PS signal, and outputting a resulting filtered RX signal as the NRX signal.

Some embodiments of the computer-readable medium further include instructions such that the transmitting of the TX signal further includes: generating a radio-frequency (RF) pulse-sequence (PS) signal having a plurality of RF pulses each characterized by an RF carrier frequency, comb filtering the RF PS signal to remove alternating ones of a plurality of RF frequency components from the RF PS signal while substantially not removing a frequency component of the RF PS signal having a frequency equal to the RF carrier frequency, and outputting a resulting filtered pulse-sequence signal; and power amplifying the filtered pulse-sequence signal to form the TX signal; and such that the removing artifacts of the TX signal from the received RX signal further includes comb filtering the RX signal to remove at least the alternating ones of the plurality of RF frequency components that were not removed from the RF PS signal, and outputting a resulting filtered RX signal as the NRX signal.

Some embodiments of the computer-readable medium further include instructions such that the transmitting of the TX signal further includes: generating a radio-frequency (RF) pulse-sequence (PS) signal having a plurality of RF pulses each characterized by an RF carrier frequency, surface-acoustic-wave (SAW) filtering the RF PS signal to remove selected ones of a plurality of RF frequency components from the RF PS signal while substantially not removing a frequency component of the RF PS signal having a frequency equal to the RF carrier frequency, and outputting a resulting filtered pulse-sequence signal, and power amplifying the filtered pulse-sequence signal to form the TX signal; and such that the removing artifacts of the TX signal from the received RX signal further includes SAW filtering the RX signal to remove at least the selected ones of the plurality of RF frequency components that were not removed from the RF PS signal, and outputting a resulting filtered RX signal as the NRX signal.

Some embodiments of the computer-readable medium further include instructions such that the transmitting of the TX signal further includes: generating a radio-frequency (RF) pulse-sequence (PS) signal having a plurality of RF pulses each characterized by an RF carrier frequency, preprocessing the RF PS signal to form a preprocessed transmit signal, distributively power amplifying the preprocessed transmit signal within the bore of the MR magnet to obtain a high-power RF signal, and coupling the high-power RF signal to the plurality of antenna elements in the bore of the MR magnet; and such that the removing artifacts of the TX signal from the received RX signal to form the NRX signal further includes preamplifying to form the NRX signal after the removing of the artifacts of the TX signal. This computer-readable medium further include instructions such that the method further includes controlling the distributively power amplifying and the preamplifying of the received RF signals by frequency-tuning and impedance-matching signals.

In some embodiments, the present invention provides an apparatus that includes: an MR magnet that has a bore; a magnetic-resonance (MR) coil that has a plurality of antenna elements located in the bore of the MR magnet; a transmitter operably coupled to, and configured to transmit an MR transmit signal (TX signal) from, the MR coil; a receiver configured to receive an MR receive signal (RX signal) from the MR coil simultaneously with the transmission of the MR transmit signal (TX signal); an artifact remover circuit configured to remove artifacts of the TX signal from the received MR receive signal (RX signal) to form a net received signal (NRX signal); and a processor configured to process the net received signal (NRX signal) and to generate MR output data from the processed NRX signal.

In some embodiments of the apparatus, the artifact remover further includes: a splitter configured to split an RF pulse into a first portion and a second portion, wherein the first portion is amplified and transmitted as the MR transmit signal (TX); and a subtractor circuit configured to subtract the second portion from the received MR receive signal (RX) to form the NRX signal.

In some embodiments of the apparatus, the transmitter includes a plurality of power amplifiers, including a first power amplifier and a second power amplifier both located in the bore of the MR magnet, and wherein the first power amplifier is further configured to couple a first high-power RF pulse to at least the first antenna element but not to the second antenna element and the second power amplifier is configured to couple a second high-power RF pulse to at least the second antenna element but not to the first antenna element.

Some embodiments of the apparatus further include a first heat-transmission coupler configured to couple heat from the first power amplifier primarily to the first antenna element, and a second heat-transmission coupler configured to couple heat from the second power amplifier primarily to the second antenna element.

In some embodiments of the apparatus, the first power amplifier receives a signal that has a power of less than one watt and generates the first high-power pulse to have a power of at least 100 watts.

In some embodiments of the apparatus, the first power amplifier receives a signal that has a power of less than one watt and generates the first high-power pulse to have a power of at least 1000 watts.

Some embodiments of the apparatus further include a controller configured to electrically control an impedance of the first antenna element to match an impedance of the first power amplifier.

Some embodiments of the apparatus further include a programmable information-processing device operatively coupled to control operation of the plurality of power amplifiers in the MRI coil from a location at least one meter away from the MRI coil.

Some embodiments of the apparatus further include: a programmable information-processing device operatively coupled to control operation of the plurality of power amplifiers in the MRI coil from a location at least one meter away from the MRI coil; an electrical controller configured to control an impedance of the first antenna element to match an impedance of the power amplifying; and a feedback circuit operatively coupled to the programmable information-processing device to provide feedback control to the electrical controller in order to control the impedance of the first antenna element.

In some embodiments of the apparatus, the transmitter further includes: a sequence generator configured to generate a radio-frequency (RF) pulse-sequence (PS) signal having a plurality of RF pulses each characterized by an RF carrier frequency, a filter coupled to receive the plurality of RF pulses from the sequence generator and configured to filter the RF PS signal to remove a plurality of RF frequency components from the RF PS signal and substantially not remove a frequency component of the RF PS signal having a frequency equal to the RF carrier frequency, and to output a resulting filtered pulse-sequence signal, and a power amplifier coupled to receive and amplify the filtered pulse-sequence signal to form the TX signal; and the artifact remover circuit further includes: a filter configured to receive and filter the RX signal to remove at least the plurality of RF frequency components that were left in the RF PS signal, and to output a resulting filtered RX signal as the NRX signal.

In some embodiments of the apparatus, the transmitter further includes: a sequence generator configured to generate a radio-frequency (RF) pulse-sequence (PS) signal having a plurality of RF pulses each characterized by an RF carrier frequency, a comb filter coupled to receive the plurality of RF pulses from the sequence generator and to remove alternating ones of a plurality of RF frequency components from the RF PS signal while substantially not removing a frequency component of the RF PS signal having a frequency equal to the RF carrier frequency, and outputting a resulting filtered pulse-sequence signal, and a power amplifier coupled to receive and amplify the filtered pulse-sequence signal to form the TX signal; and the artifact remover circuit further includes: a comb filter configured to receive and filter the RX signal to remove at least the plurality of RF frequency components that were left in the RF PS signal, and to output a resulting filtered RX signal as the NRX signal.

In some embodiments of the apparatus, the transmitter further includes: a sequence generator configured to generate a radio-frequency (RF) pulse-sequence (PS) signal having a plurality of RF pulses each characterized by an RF carrier frequency, surface-acoustic-wave (SAW) filter coupled to receive the plurality of RF pulses from the sequence generator and to remove selected ones of a plurality of RF frequency components from the RF PS signal while substantially not removing a frequency component of the RF PS signal having a frequency equal to the RF carrier frequency, and outputting a resulting SAW-filtered pulse-sequence signal, and a power amplifier coupled to receive and amplify the filtered pulse-sequence signal to form the TX signal; and the artifact remover circuit further includes a SAW filter configured to receive and filter the RX signal to remove at least the plurality of RF frequency components that were left in the RF PS signal, and to output a resulting filtered RX signal as the NRX signal.

In some embodiments of the apparatus, the transmitter further includes: a sequence generator configured to generate a radio-frequency (RF) pulse-sequence (PS) signal having a plurality of RF pulses each characterized by an RF carrier frequency, a pre-processor configured to preprocess the RF PS signal to form a preprocessed transmit signal, a distributed power amplifier operatively coupled to receive the preprocessed transmit signal within the bore of the MR magnet, to amplify it to obtain a high-power RF signal, and to couple the high-power RF signal to the plurality of antenna elements in the bore of the MR magnet; and the artifact remover circuit further includes: a preamplifier configured to form the NRX signal after the removing of the artifacts of the TX signal; and the apparatus further includes a controller configured to frequency- and impedance-match signals to control the distributed power amplifier and the preamplifier.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," " "second," and "third," etc., are used merely as labels, and are not intended to impose numerical requirements on their objects.

What is claimed is:

1. A method comprising:
   generating a generated RF pulse-sequence (RFPS) signal;
   preprocessing the RFPS signal using a set of one or more transmit-preprocessing parameters to form a preprocessed transmit (PTX) signal;
   amplifying the PTX signal to form a power-amplified TX signal;
   transmitting the power-amplified TX signal from a set of one or more transmit-antenna elements;
   receiving a receive (RX) signal from a set of one or more receive-antenna elements;
   post-processing the obtained RX signal using a set of one or more receive-post-processing parameters to generate a subtractable version of the transmit (STX) signal, and subtracting the STX signal from the RX signal to obtain a net received (NRX) signal;
   analyzing the NRX signal to determine whether the NRX signal meets predetermined criteria that include frequency and impedance criteria;
   when the analyzing determines that the NRX signal meets the predetermined criteria, forming a magnetic resonance (MR) image; and
   when the analyzing determines that the NRX signal does not meet the predetermined criteria, adjusting at least one of the set of preprocessing parameters and repeating the preprocessing, amplifying, transmitting, receiving, post-processing, and analyzing of the generated RFPS signal.

2. The method of claim 1, wherein the receiving of the RX signal occurs simultaneously with the transmitting of the power-amplified TX signal.

3. The method of claim 1, wherein the set of one or more receive-antenna elements are part of an MRI coil, wherein the transmitting of the power-amplified TX signal from the set of one or more transmit-antenna elements and the receiving of the RX signal from the set of the one or more receive-antenna elements occur simultaneously.

4. The method of claim 1, wherein the preprocessing of the RFPS signal includes frequency filtering the RFPS signal, and wherein the adjusting of the preprocessing parameter includes adjusting a frequency-filtering parameter.

5. The method of claim 1, further comprising: automatically adjusting a resonant frequency and impedance of the set of one or more transmit-antenna elements.

6. The method of claim 1, further comprising: automatically adjusting a resonant frequency and impedance of the set of one or more receive-antenna elements.

7. The method of claim 1, further comprising: automatically adjusting a resonant frequency and impedance of the set of one or more transmit-antenna elements; and automatically adjusting a resonant frequency and impedance of the set of one or more receive-antenna elements.

8. The method of claim 1, wherein the RFPS signal has a power of less than one watt and the power-amplified TX signal has a power of at least 100 watts.

9. The method of claim 1, wherein the RFPS signal has a power of less than one watt and the power-amplified TX signal has a power of at least 1000 watts.

10. A method comprising:
generating a generated RF pulse-sequence (RFPS) signal;
preprocessing the RFPS signal using a set of one or more transmit-preprocessing parameters to form a preprocessed transmit (PTX) signal;
amplifying the PTX signal to form a power-amplified TX signal;
transmitting the power-amplified TX signal from a set of one or more transmit-antenna elements;
receiving a receive (RX) signal from a set of one or more receive-antenna elements;
post-processing the obtained RX signal using a set of one or more receive-post-processing parameters to obtain a net received (NRX) signal;
analyzing the NRX signal to determine whether the NRX signal meets predetermined criteria that include frequency and impedance criteria;
when the analyzing determines that the NRX signal meets the predetermined criteria, forming a magnetic resonance (MR) image; and
when the analyzing determines that the NRX signal does not meet the predetermined criteria, adjusting at least one of the set of preprocessing parameters and repeating the preprocessing, amplifying, transmitting, receiving, post-processing, and analyzing of the generated RFPS signal, and
wherein the preprocessing of the RFPS signal includes actively adjusting a gain and phase of the RFPS signal, wherein the transmitting of the power-amplified TX signal includes coupling the power-amplified TX signal to a plurality of the set of one or more transmit-antenna elements, wherein the post-processing of the obtained RX signal includes: actively adjusting gains, phases, and signal combinations of the obtained RX signal, generating a subtractable version of the transmit (STX) signal, and subtracting the STX signal from the obtained RX signal to obtain the NRX signal, and wherein the RFPS signal has a power of less than one watt and the power-amplified TX signal has a power of at least 100 watts.

11. An apparatus comprising:
means for generating a generated RF pulse-sequence (RFPS) signal;
means for preprocessing the RFPS signal using a set of one or more transmit-preprocessing parameters to form a preprocessed transmit (PTX) signal;
means for amplifying the PTX signal to form a power-amplified TX signal;
means for transmitting the power-amplified TX signal;
means for receiving a receive (RX) signal;
means for post-processing the obtained RX signal using a set of one or more receive-post-processing parameters to generate a subtractable version of the transmit (STX) signal, and subtracting the STX signal from the RX signal to obtain a net received (NRX) signal;
means for analyzing the NRX signal to determine whether the NRX signal meets a predetermined criteria that includes frequency and impedance criteria;
means for forming a magnetic resonance (MR) image when the means for analyzing determines that the NRX signal meets the predetermined criteria; and
means for adjusting at least one of the set of preprocessing parameters when the analyzing determines that the NRX signal does not meet the predetermined criteria, and for repeating the preprocessing, amplifying, transmitting, receiving, post-processing, and analyzing of the generated RFPS signal.

12. The apparatus of claim 11, wherein the means for receiving the RX signal receives the RX signal simultaneously with transmitting of the power-amplified TX signal from the means for transmitting.

13. The apparatus of claim 11, wherein the means for receiving are part of an Mill coil, wherein transmitting from the means for transmitting and receiving of the RX signal from the means for receiving occur simultaneously.

14. The apparatus of claim 11, wherein the means for preprocessing the RFPS signal includes means for frequency filtering the RFPS signal.

15. The apparatus of claim 11, further comprising means for adjusting a resonant frequency and impedance of the means for transmitting.

16. The apparatus of claim 11, further comprising means for adjusting a resonant frequency and impedance of the means for receiving.

17. A method comprising:
generating a transmit (TX) signal using a radio frequency (RF) system of a magnetic resonance imaging (MM) system;
forming an adjusted TX signal using the RF system, wherein the forming of the adjusted TX signal includes actively adjusting a gain and phase of the TX signal;
transmitting the adjusted TX signal from a plurality of transmit antenna elements of the RF system;
receiving a plurality of receive (RX) signals using the RF system;
forming an adjusted RX signal using the RF system, wherein the forming of the adjusted RX signal includes actively adjusting gains and phases of the plurality of RX signals;
generating a subtractable version of the transmit (STX) signal using the RF system; and
subtracting the STX signal from the adjusted RX signal to obtain a net received signal (NRX).

18. The method of claim 17, wherein the forming of the adjusted TX signal further includes actively adjusting a frequency of the TX signal.

19. The method of claim 17, wherein the forming of the adjusted RX signal further includes actively adjusting a signal combination of the plurality of RX signals.

20. A method comprising:
generating a transmit (TX) signal using a radio frequency (RF) system of a magnetic resonance imaging (MM) system;
forming an adjusted TX signal using the RF system, wherein the forming of the adjusted TX signal includes actively adjusting a gain and phase of the TX signal
transmitting the adjusted TX signal from a plurality of transmit antenna elements of the RF system;
receiving a plurality of receive (RX) signals using the RF system;
forming an adjusted RX signal using the RF system, wherein the forming of the adjusted RX signal includes actively adjusting gains and phases of the plurality of RX signals;
generating a subtractable version of the transmit (STX) signal using the RF system; and
subtracting the STX signal from the adjusted RX signal to obtain a net received signal (NRX),
wherein the forming of the adjusted TX signal includes power amplifying the adjusted TX signal, and wherein the method further includes:
analyzing the NRX signal to determine whether the NRX signal meets a predetermined criteria that includes frequency and impedance criteria;

when the analyzing determines that the NRX signal meets the predetermined criteria, forming a magnetic resonance (MR) image;

when the analyzing determines that the NRX signal does not meet the predetermined criteria, adjusting at least one of a set of preprocessing parameters and iterating the method; and wherein the TX signal has a power of less than one watt and the power-amplified TX signal has a power of at least 1000 watts.

* * * * *

UNITED STATES PATENT AND TRADEMARK OFFICE
CERTIFICATE OF CORRECTION

PATENT NO.         : 10,627,463 B2  
APPLICATION NO.    : 14/818282  
DATED              : April 21, 2020  
INVENTOR(S)        : Scott M. Schillak et al.

Page 1 of 1

It is certified that error appears in the above-identified patent and that said Letters Patent is hereby corrected as shown below:

In the Claims

Column 42, Claim 13, Line 6, "Mill" should be --MRI--.

Column 42, Claim 20, Line 45, "(MM)" should be --(MRI)--.

Signed and Sealed this  
Twenty-first Day of July, 2020

Andrei Iancu  
*Director of the United States Patent and Trademark Office*